United States Patent
Buck-Gengler

(10) Patent No.: US 7,444,566 B2
(45) Date of Patent: Oct. 28, 2008

(54) MEMORY DEVICE FAIL SUMMARY DATA REDUCTION FOR IMPROVED REDUNDANCY ANALYSIS

(75) Inventor: Joel Buck-Gengler, Longmont, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 414 days.

(21) Appl. No.: 11/368,751

(22) Filed: Mar. 6, 2006

(65) Prior Publication Data

US 2007/0220379 A1  Sep. 20, 2007

(51) Int. Cl.
*G01R 31/28* (2006.01)
*G11C 29/00* (2006.01)

(52) U.S. Cl. .................. 714/725; 714/718
(58) Field of Classification Search ......... 714/724–727, 714/733–736, 797, 799, 30
See application file for complete search history.

(56) References Cited

U.S. PATENT DOCUMENTS 6,667,918 B2 * 12/2003 Leader et al. ............... 365/201
7,055,074 B2 *  5/2006 Hughes et al. .............. 714/710
7,339,844 B2 *  3/2008 Krech et al. ................ 365/200

\* cited by examiner

*Primary Examiner*—Phun M Chung
(74) *Attorney, Agent, or Firm*—Holland & Hart, LLP

(57) ABSTRACT

A method and apparatus is presented for extracting sparse failure information from an error data image of a memory device by scanning the error data image in only two passes. During a first scan pass, the error data image is scanned for failures in a first set of memory cell groups organized along a first dimension, keeping track of failures seen in each of the respective memory cell groups in the first set, and keeping track of and designating as a must-repair memory cell group any memory cell group whose respective number of failures equals or exceeds a first maximum failure threshold. During a second scan pass, the error data image is scanned for failures in a second set of memory cell groups organized along a second dimension, keeping track of failures seen in each of the respective memory cell groups in the second set, and keeping track of and designating as a must-repair memory cell group any memory cell group whose respective number of failures equals or exceeds a second maximum failure threshold; and generating tag images containing only sparse failure information.

16 Claims, 21 Drawing Sheets

MEMORY DEVICE FAIL SUMMARY DATA REDUCTION FOR IMPROVED REDUNDANCY ANALYSIS

BACKGROUND OF THE INVENTION

Computers rely on random access memory to store program instructions and data. Computer memories are made up of memory cells, where each cell stores a single bit of data. Each computerized instruction and/or computerized element of data typically comprises a set of bits meaningfully organized into a simultaneously addressable collection of bits such as a byte (generally 8 bits), a word (generally a multiple of bytes), a block (generally a multiple of words), etc. The position of a bit within a given byte, word, block, etc. (hereinafter referred to collectively as "bytes") is meaningful in that meaning is given to bytes of data or instructions according to the values of the bits as positioned within the bytes according to a predefined ordered format.

Bytes and words are therefore typically addressed as a single entity using an address bus, a data bus, and memory cell enablement circuitry. More particularly, an address is placed on the address bus, cells of the memory device are enabled by activating write or read enable lines corresponding to the addressed cells, and data is either written to the cells or read from the cells addressed by the address bus, depending on whether the operation is a write operation or a read operation.

To keep up with the demand for faster and more capable systems, modern memory devices such as random access memories (or RAMs), Static RAMs (SRAMs), etc., are very dense. Because of their density, and the limitations of the manufacturing process, semiconductor memory devices will often contain one or more defective memory cells immediately after manufacture.

During the manufacturing and testing of a memory device, memory testing is performed in which all of the memory cells of the memory device are tested. Typical tests include sequentially incrementing or decrementing memory addresses while writing 0's and 1's into the memory cells. It is customary to refer to a collection of 1's and 0's being simultaneously written to or read from during a memory cycle as a "vector", while the term "pattern" refers to a sequence of vectors. It is conventional for tests to include writing patterns into the memory space such as checkerboards, walking 1's and butterfly patterns.

As mentioned previously, individual memory cells may fail during test. To improve the yield of these devices, manufacturers typically incorporate redundant memory cell groups such as redundant rows and/or redundant columns of cells. It is often possible to substitute the redundant memory cell groups in place of corresponding memory cell groups in the memory device that contain one or more defective memory cells, thereby yielding a fully functional memory device. The redundant memory cell groups may be mapped into the memory device to replace memory cell groups in the memory device that have one or more memory cell defects. The process of identifying defective memory cell groups that contain failing memory cells and mapping redundant memory cell groups to corresponding defective memory cell groups in the memory device is called "redundancy analysis".

Typically, a single given memory cell is a member of multiple different memory cell groups, each addressed by different dimensional components of the corresponding memory device address. A single memory cell may therefore be repaired using one of multiple different available redundant memory cell groups organized along different dimensions of the memory device. For example, the memory device may be organized into dimensions comprising rows and columns, allowing for memory cell groups that comprise rows and memory cell groups that comprise columns. The memory device may provide a number of redundant rows and a number of redundant columns that may be mapped to replace various rows and columns in the memory device. In this example, there may be available both a redundant row and a redundant column, either of which could be used to repair the given cell. If there are multiple failures along the same row, then it is better to use a single redundant row to repair the multiple memory cell failures rather than to use several redundant columns since it would be more efficient and only a limited number of redundant memory rows and columns are available. Suppose, for instance, that there are only four redundant columns and four redundant rows available to repair defective memory cells in a given memory device. In this example, if there is a row that has failures at three different columns, that row can be repaired either by using three of the redundant columns, or by using just one of the redundant rows. If, however, there is a row that has failures at five different columns, then that row can only be repaired by making use of one of the redundant rows since there are not enough redundant columns available to repair all of the failures in this row. A row that can only be repaired using one of the available redundant rows is considered a "must repair" row. Similarly, a column that can only be repaired using one of the available redundant columns is considered a "must repair" column.

It is known that once a given row or column has been identified as a "must repair" row or column, respectively, due to detection of a threshold number of memory cell defects in that row or column, all of the memory cell defects in the given row or column will be repaired by an available redundant row or column, respectively, so that it is unnecessary to further test or analyze any remaining untested memory cells in the given row or column of the memory device for defects.

How repair of defective memory cells using redundant memory cell groups is actually achieved on the circuit level is well understood by those who manufacture such devices, so it is sufficient for those skilled in the art to simply say that incorporated into those devices are some number of selectably destroyable elements whose destruction enables gating that in turn alters the internal logic of an associated circuit. This ability is used to route internal signals to replacement circuits that substitute for defective ones.

Ideally, a memory tester should be able to identify a need for repair in the memory device under test, the location of the required repairs, and the type of repairs needed, and then must be able to perform the appropriate repairs.

In certain memory testers, hardware may be designed to capture an entire bitmap, sometimes referred to as an Error Catch RAM (ECR) or more generally, as used hereinafter, an "error data image", of the device contents. Typically, the error data image is addressed by the same address as, or by an address derived from, the address that is applied to the memory device under test. During a test, when the contents of a memory cell in the memory device matches or fails to match expected results, a corresponding bit at that address in the error data image is either set or cleared, according to the convention in use. For example, a zero ("0") may be used in the error data image to represent a failure to match and a one ("1") may be used to represent a match. The error data image may be analyzed to find the errors and the optimum repair solution. This strategy significantly reduces the complexity of the analysis task, as well as reducing test time.

Often, multiple "tag" images are generated during the testing of the memory device to further reduce the analysis time.

Each tag image maps memory cell defects detected in the memory device over a single respective dimension of the memory device. In the example above, one tag image may contain a map of failing rows, and another tag image may contain a map of failing columns. Within the row tag, one location may contain a flag indicating whether there were any errors in any of the memory cells in the corresponding row of the memory device. Similarly, within the column tag, one location may contain a flag indicating whether there were any errors in any of the memory cells in the corresponding column of the memory device. Because in the tag images a single memory location (typically only a bit in size) is used to represent an entire row or column of the memory device, a tag image is substantially smaller than a full error data image, making it possible to quickly identify which memory cell groups (in the above example, which rows and columns) have failures. The tag images thus operate to store an indexed collection of detected events for later inspection.

FIG. 1 is a block diagram of a conventional memory test configuration. A memory tester 4 applies a series of test vectors 3 to a memory device under test (DUT) 2 to detect defects in any of the memory cells of the memory DUT 2. The DUT 2 includes an array of memory cells 2a arranged in memory cell groups of rows ([0 ... X−1]) and memory cell groups of columns ([0 ... Y−1]). Traditionally, an error data image 6 of the same size as (i.e., same number of rows and columns) and addressable in the same way as, the memory device under test (DUT) 2 is provided to store a bit corresponding to each memory cell of the memory DUT 2. Conventionally, a value of 0 in a bit cell of the error data image 6 indicates that a failure occurred during testing of the corresponding bit cell 2a in the memory DUT 2, while a 1 indicates that no failure was detected in the corresponding bit cell 2a in the memory DUT 2. Of course, other conventions may be used to indicate the pass or fail of corresponding bit cells in the memory DUT 2.

A set of redundant memory cell groups of rows 8 ([0 ... M−1]) and a set redundant memory cell groups of columns 10 ([0 ... N−1]) may be implemented for use in repairing defects detected in memory cells 2a of the DUT 2 addressed by corresponding row and column addresses.

Tag images 14, 12 may assist in performing analysis of the error data image 6 to determine how to repair any detected defects in the memory DUT. Traditionally, row and column tag images 14, 12 implement a single bit per address in the corresponding row or column dimension to indicate a failure in the corresponding row or column of the DUT 2.

As an illustrative example, consider that an address applied to the DUT 2 might be separable into row and column dimensions with corresponding row X and column Y address components that relate to internal organization of the memory DUT 2. The memory DUT 2 is therefore addressable in two dimensions and the address applied to the DUT 2 has the X and Y address components embedded therein, but perhaps not in an obvious or convenient way. Suitable gating circuits can extract, for example, the Y address component and apply it as an address to a column tag image 12, which allows storage of information that is indexed according to the Y address. Similarly, gating circuits can extract the X address component and apply it as an address to a row tag image 14, which allows storage of information that is indexed according to the X address. Traditionally, the information stored in each entry of the row and column tag images is a single bit whose end-of-test meaning is that a failure did or did not occur at least once in the DUT 2 along the corresponding respective X addressed row or Y addressed column. By generating tag images for both row X and column Y address components, a test analyzer can obtain useful information about the failures in a memory DUT whose internal organization includes the notions of row X and column Y addresses. The use of tag images 12, 14 may realize a significant reduction in tester memory requirements as the needed tag image storage requirements consist of a number of locations equal to only the sum of the X and Y address spaces, rather than equal to their product, which is what an error data image would require.

A common failure mechanism of memory devices reduces the effectiveness of conventional tag RAMs. Many times devices have a stuck group of memory cells in which many or all addresses within that particular memory cell group are defective. For example, in the memory DUT 2 of FIG. 1, testing may reveal that the DUT 2 has a stuck row or a stuck column in which many or all addresses within that particular stuck row or a stuck column are defective. A single redundant memory cell group may repair the stuck memory cell group in the memory device. However, in devices that are organized in memory cell groups in multiple dimensions so that a given address applied to the memory device includes multiple dimensional address components embedded therein, the tag images may be rendered ineffective for purposes of redundancy analysis, as best understood from the following example. Again referring to DUT 2 of FIG. 1, which is organized into memory cell groups (rows 0 ... X−1 and columns 0 ... Y−1) in two dimensions (a row dimension and a column dimension), a single redundant row may repair a stuck row in the DUT 2. However, the column tag 12 may indicate a failure in all Y addresses due to the failures in all memory cells of the stuck row of the DUT 2. If the memory DUT 2 has both a stuck row and a stuck column, then both tag images 12 and 14 may indicate complete failures in all addresses, whereas in actuality it may be merely that all X addresses within a single column and all Y addresses within a single row are defective. In devices that have stuck row or stuck column defects, the usefulness of the tag images may therefore be limited or even rendered completely ineffective insofar as extracting information concerning rows and/or columns containing only sparse failures.

Traditional tag images do not filter out the "must repair" rows and columns, which, as illustrated by the previous example, can render the tag image next to useless in terms of extracting information concerning sparse failures. The problems with the tag are further complicated when a single error image is used to capture the error data for multiple, independent, memory devices at the same time (i.e., when there are multiple memory devices under test).

Traditionally, the tag images must be regenerated, excluding the failures from the "must repair" memory cell groups, to recover sparse failure information from the tag images. This methodology requires re-scanning all of the rows and columns in the captured error image, excluding the failures from known "must repair" memory cell groups, and must be repeated each time another "must repair" memory cell group is identified based on the current tag images. Generation of tag images containing only sparse failures is therefore an iterative process, potentially requiring many scanning passes of the captured error image. The traditional methodology identifying "must repair" memory cell groups and for recovering sparse failure information from the captured error image may therefore require significant processing time as the captured error image is scanned and re-scanned according to this iterative process.

Accordingly, a need exists for an improved technique for identifying "must repair" memory cell groups and for recovering sparse failure information from the captured error image. A need also exists for a technique for streamlining the redundancy analysis step in a memory test process.

SUMMARY OF THE INVENTION

Embodiments of the invention include a method for extracting sparse failure information from an error data image of a memory device. The error data image comprises corresponding error data for each of a plurality of memory cells organized into a plurality of memory cell groups along a plurality of dimensions of the memory device, wherein each memory cell group is addressable by one of a plurality of address components corresponding to one of the plurality of dimensions. The error data image comprises a plurality of bits, each bit corresponding to a different one of the memory cells in the memory device and having a value indicating whether or not the corresponding memory cell is defective. The error data image is scanned for failures in a first set of memory cell groups organized along a first dimension between a selected set of addresses, keeping track of respective numbers of failures seen in each of the respective memory cell groups in the first set, and keeping track of and designating as a must-repair memory cell group any memory cell group whose respective number of failures equals or exceeds a first maximum failure threshold. The error data image is scanned for failures in a second set of memory cell groups organized along a second dimension between the selected set of addresses, keeping track of respective numbers of failures seen in each of the respective memory cell groups in the second set, and keeping track of and designating as a must-repair memory cell group any memory cell group whose respective number of failures equals or exceeds a second maximum failure threshold. One or both of a first tag image associated with memory cell groups of the first set and a second tag image associated with memory cell groups of the second set is generated. The first tag image indicates memory cells of the first set containing failures and the second tag image indicates memory cell groups of the second set containing failures. At least one of the first tag image and the second tag image exclude indication of failures in designated must-repair memory cell groups of the corresponding set.

In one embodiment, failure information is tracked on a per IO bit basis.

In one embodiment, failure information is tracked on a per IO bit group basis, wherein an IO bit group comprises a plurality of simultaneously addressable IO bits.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

In the following detailed description of the embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural logical and electrical changes may be made without departing from the spirit and scope of the present inventions. The following detailed description is, therefore, not to be taken in a limiting sense, and the scope of the present inventions is defined only by the appended claims.

Figure 1:
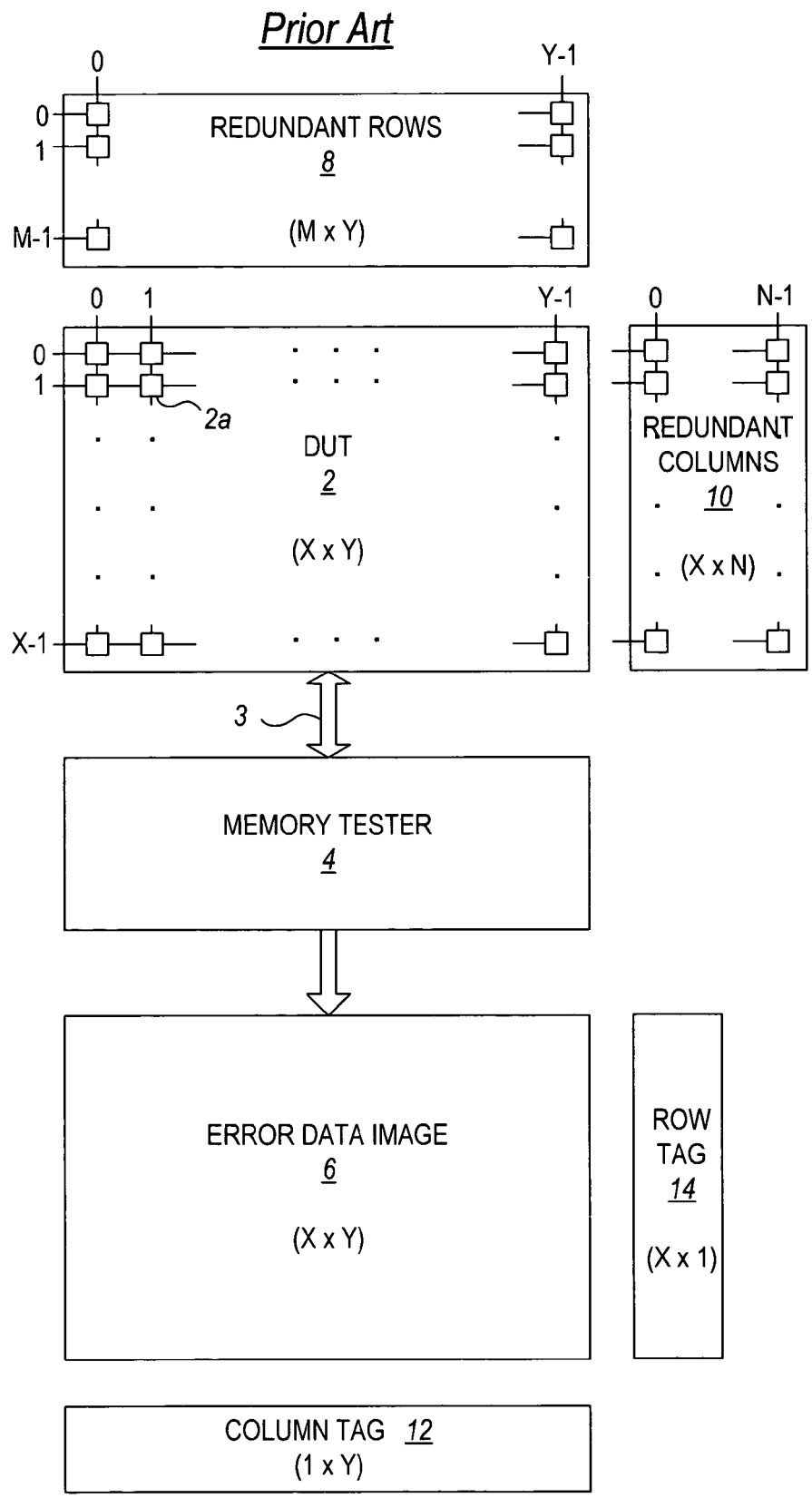
FIG. 1 is a block diagram of a prior art memory test configuration.
Figure 2A:
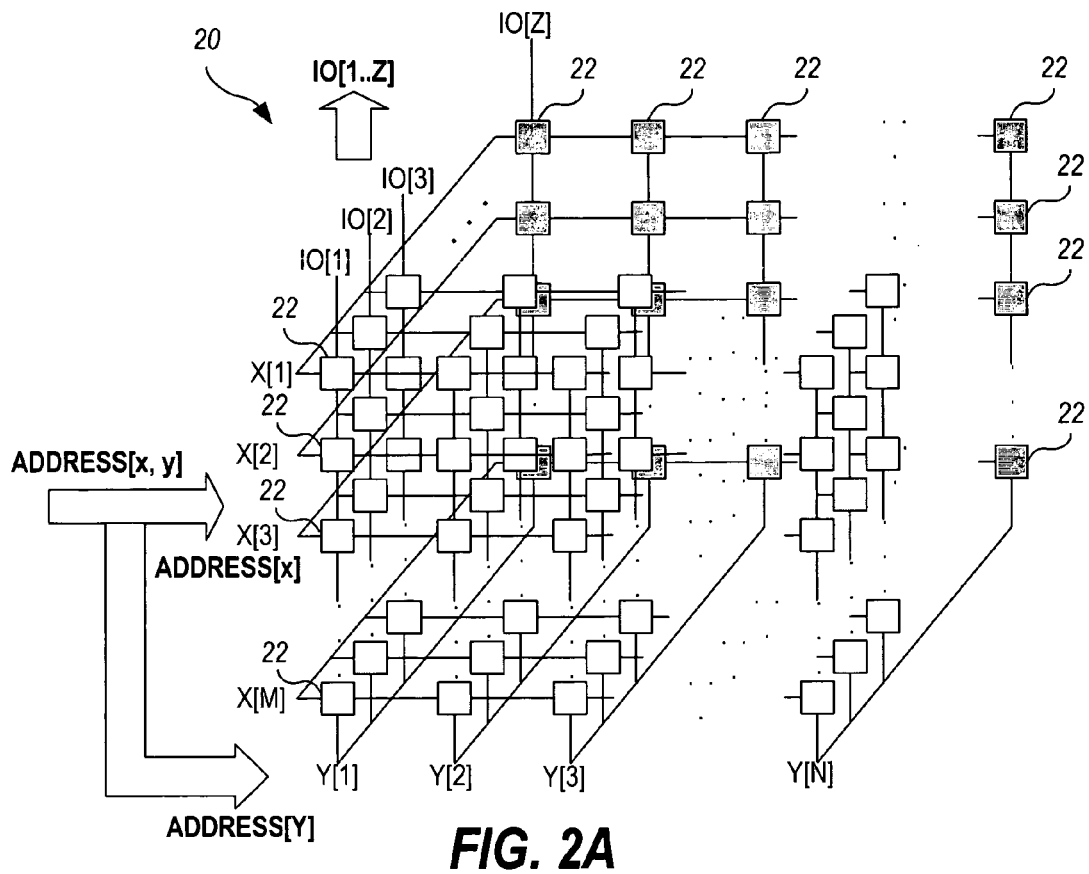
FIG. 2A is a perspective structural view of a memory device.

FIG. 2A shows a memory device 20 comprising a plurality of memory cells 22. Each memory cell 22 is addressed by an address ADDRESS[x, y] having corresponding row x (x=X[1 . . . M]) and column y (y=Y[1 . . . N]) address components. The memory device may have one or more simultaneously addressable input/output (IO) lines IO[1]-IO[Z] that are respectively switchably connectable to respective memory cells 22 in the memory device 20 as determined by the value of the applied address ADDRESS[x, y].

It will be appreciated that in the simplest case, the memory device is a single bit wide device (i.e., Z=1), meaning that any given address ADDRESS[x, y] accesses a single memory cell in the device. Data may be input to or output from a single memory cell in the memory device via a single IO line (e.g., IO[1]).

Typically, however, a memory device 20 comprises multiple single bit wide devices to make up a z-bit wide device (z=Z, Z>1). In this case, data may be simultaneously input to or output from Z memory cells in the memory device via Z IO lines IO[1]-IO[Z]. Each of the Z single bit wide devices receives the same ADDRESS[x, y] with the same row and column address components (X[x] and Y[y]), but each of the Z single bit wide devices contributes a single bit at a corresponding bit position in the Z-bit IO data value. Each of the Z single bit wide devices may have a different failure distribution. For example, a failure may occur in row X[1], column Y[1] for IO bit IO[1], but not in row X[1], column Y[1] for IO bit IO[2].

In one embodiment of a memory device, there may be available a set of repair columns that may be used to repair an entire column for any individual IO bit in any column y, and a set of repair rows that may be used to repair an entire row including all IO bits for each column in the row x.

Figure 2B:
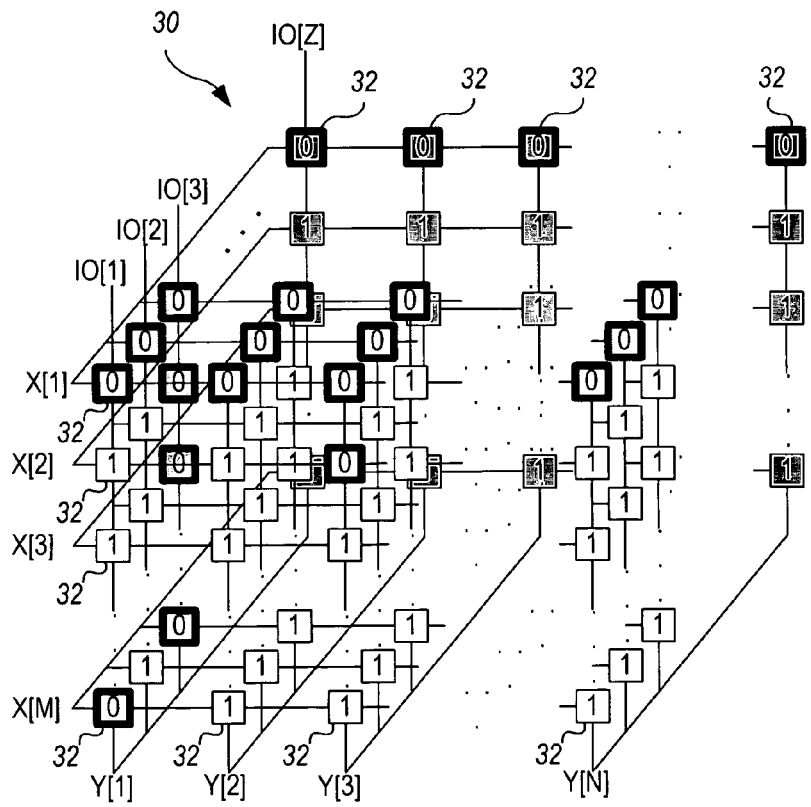
FIG. 2B is a perspective structural view of an error data image of the memory device of FIG. 2A.

FIG. 2B illustrates an error data image 30 of the memory device of FIG. 2A. As illustrated, each of the memory device 20 and the corresponding error data image 30 comprise memory cells 22, 32 organized into M rows (X[1]-X[M]) and N columns (Y[1]-Y[N]). Each of the memory device 20 and error data image 30 is Z bits wide, and provides Z IO lines IO[1]-IO[Z] that are simultaneously addressable. In one embodiment, the addressing scheme used to access the memory device 20 is identical to the addressing scheme used to access the error data image 30. In one embodiment, a "0" may be stored in a memory cell 32 of the error data image 30 to designate the presence of a failure in the corresponding memory cell 22 of the memory device 20, and a "1" may be stored in a memory cell 32 of the error data image 30 to designate no failure in the corresponding memory cell 22 of the memory device 20. By way of example only and not limitation, the error data image 30 shown indicates that the memory device 20 has failures in all of column Y[1] at bit IO[3], all of row X[1] across all IO bits, and miscellaneous sparse failures in the remaining memory cells 22.

In the ideal repair solution for the failure configuration of FIG. 2B, the stuck column (Y[1]) should be replaced with a redundant column and the stuck row (X[1]) should be replaced with a redundant row. The remaining sparse failures would be replaced by remaining available redundant columns or rows.

In accordance with embodiments of the invention, sparse failure information may be extracted from the error data image 30 by scanning the error data image 30 for failures, keeping track of locations of failures and of known must-repair memory cell groups as they are identified and excluding further counts of failures from known must-repair memory cell groups.

Figure 3:
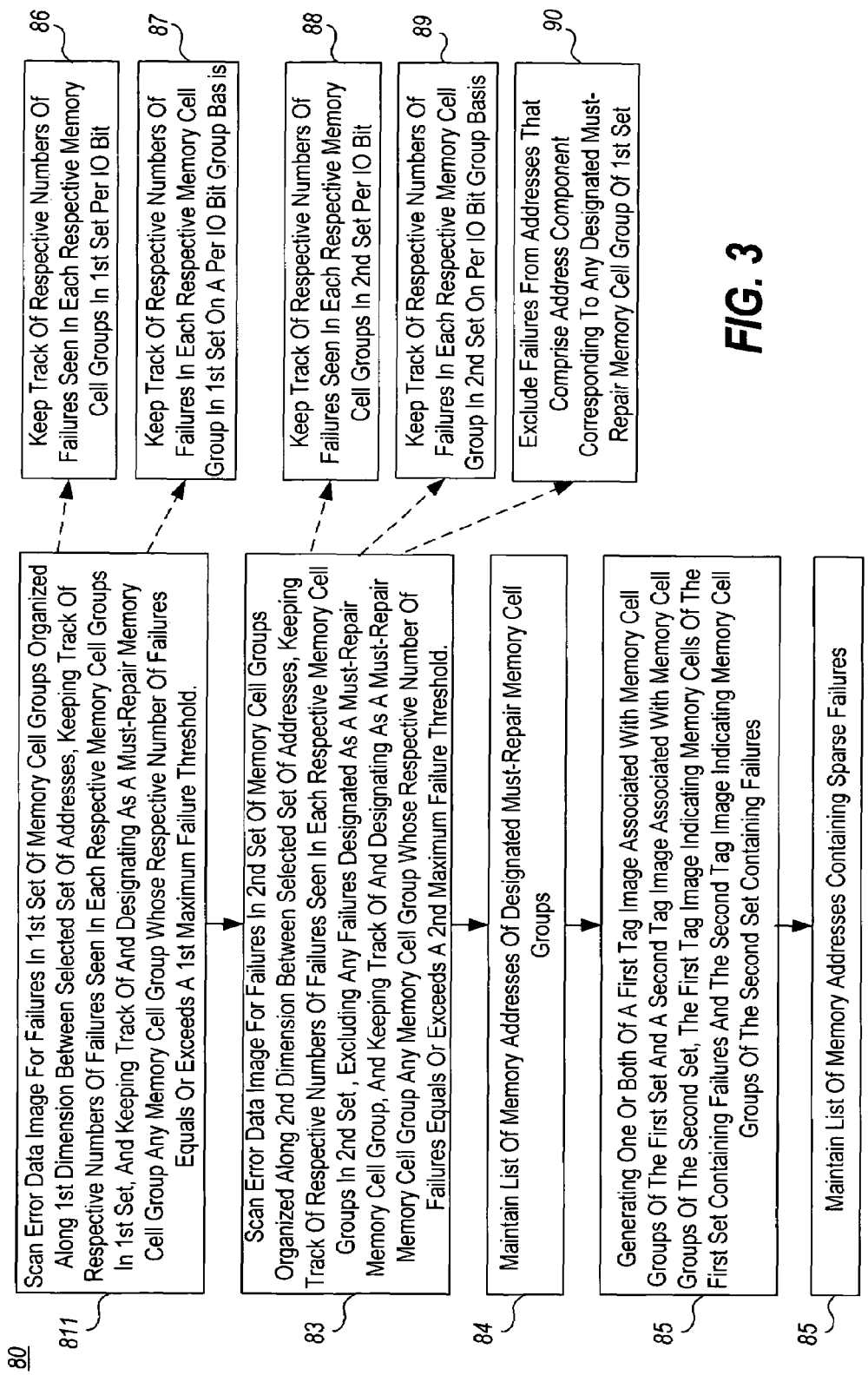
FIG. 3 is a flowchart of an exemplary method for extracting failure information from the error data image.

According to an embodiment of the scanning algorithm, a method 80 for extracting repair information from an error data image 30 of a memory device 20 is shown in FIG. 3, and includes the steps of scanning the error data image 30 for failures in a first set of memory cell groups organized along a first dimension between a selected set of addresses, while keeping track of respective numbers of failures seen in each of the respective memory cell groups in the first set, and while keeping track of and designating as a must-repair memory cell group in the first set any memory cell group in the first set whose respective number of failures equals or exceeds a first maximum failure threshold (step 81), and scanning the error data image for failures in a second set of memory cell groups organized along a second dimension between the selected set of addresses, while keeping track of respective numbers of failures seen in each of the respective memory cell groups in the second set, excluding any failures that will otherwise be repaired by a previously designated must-repair memory cell group, and while keeping track of and designating as a must-repair memory cell group any memory cell group whose respective number of failures equals or exceeds a second maximum failure threshold (step 82).

In one embodiment, the step of keeping track of respective numbers of failures seen in each of the respective memory cell groups in the first set may be performed on a per IO bit basis (step 86). In one embodiment, it may be desirable, for whatever reason, to count failures detected on any one or more of a group of IO bits as a single failure rather than as multiple failures. For example, a row repair element might repair all of the IO bits for a given row, not just a single IO bit, while a column repair element might repair only a single IO bit for a given column. In one embodiment, in each designated group of IO bits, the detection of one or more failures designated among the bits in the respective group is counted as one failure. Accordingly, the method may also include the step of keeping track of respective numbers of failures in each respective memory cell group in the first set on a per IO bit group basis (step 87).

In one embodiment, the step of keeping track of respective numbers of failures seen in each of the respective memory cell groups in the second set may be performed on a per IO bit basis (step 88). Again, to accommodate bit grouping, as described above, the method may also include the step of keeping track of respective numbers of failures in each respective memory cell group in the second set on a per IO bit group basis (step 89). In one embodiment, the step of keeping track of respective numbers of failures seen in each of the respective memory cell groups in the second set operates further to exclude counting of failures detected in an address that comprises an address component corresponding to any memory cell group of the first set that has been designated as a must-repair memory cell group of the first set (step 90).

The method may further comprise a step of generating a list of memory addresses of designated must-repair memory cell groups (step 83).

The method may further comprise a step of generating one or both of a first tag image associated with memory cell groups of the first set and a second tag image associated with memory cell groups of the second set, the first tag image indicating memory cells of the first set containing sparse failures and the second tag image indicating memory cell groups of the second set containing sparse failures (step 84).

The method may further comprise a step of generating a list of memory addresses containing sparse failures (step 85).

According to an embodiment, for example as shown in FIGS. 4-19, a number of counters keep track of respective numbers of failures seen in each IO bit, or each group of IO bits (as configured by a grouping configuration function), per element of each memory cell group in the first dimension in the selected set of addresses. For purposes of illustration, a column dimension may be selected as the first dimension, a set of columns between a selected first address and a selected second address may be selected as the memory cell groups in the first dimension, and a predetermined maximum value of errors tolerated in any column before a column is considered a must-repair column may be selected.

For each element in each memory cell group along the first dimension, the error data stored in the error data image at the specified address is obtained.

In one embodiment, the error data may be grouped, as configured by a grouping configuration function 40. The grouping configuration function assigns the IO bits into one or more groups of IO bits to allow the groups be treated as a single source of error for purposes of counting errors. Each group is assigned to a counter 42, which counts one failure if a failure is present on any of the IO bits in the group assigned to the counter 42. If no grouping is desired, the number of groups will correspond to the number of IO bits, consisting of Z groups of 1 bit each, each assigned to a different counter 42. Grouping will be discussed in more detail hereinafter.

The grouped error data GED[1 . . . Z] is temporarily stored. If the grouped error data GED[1 . . . Z] includes any bits indicating a failure, the failure is recorded in a counter 42 corresponding to the group containing the respective failed bit.

When the error data has been obtained, grouped (if so configured), and counted (if required) for each element in a given memory cell group in the first dimension, the counters 42 are examined. Any counter whose final count value has not changed from its initialized value indicates that no errors were seen on any IO bit in the corresponding IO bit group of the particular memory cell group. Any counter whose final count value has counted at least the predetermined maximum value of errors tolerated in any memory cell group of the first dimension indicates that the particular memory cell group on the corresponding IO bit group must be repaired with a redundant memory cell group. The location and redundant memory cell group type are recorded. Any counter whose final count value has counted at least some failures but not the maximum tolerated number of failures indicates that sparse failure(s) exist in the memory cell group for the corresponding IO bit group. A merge mask associated with the first dimension contains mask bits set for each IO bit or group of IO bits whose corresponding memory cell group(s) in the memory device has been designated as "must-repair". Corresponding bits of the merge mask are then applied to corresponding bits of each of the grouped error data GED[1 . . . Z] associated with each memory cell group in the first dimension belonging to the selected set of addresses (stored in the IRowTag 44), and any unmasked errors are accumulated into the Final-RowTag 48.

These steps are repeated for each memory cell group in the first dimension that belongs to the selected set of addresses, to generate a final tag image associated with the second dimension. Each entry in the final tag image associated with the second dimension indicates whether or not a failure exists somewhere in the corresponding memory cell group of the second dimension. For example, if the columns are selected to be the first dimension, scanning of the columns in the pass described above would generate a final row tag image. The final row tag image would contain an entry for each row in the selected addresses and each entry would comprise a bit corresponding to each IO bit or group of IO bits.

A tag image associated with the first dimension may then be generated in a similar manner by scanning for failures in the memory cell groups in the second dimension in the selected set of addresses. In this scan pass, memory cell groups in the second dimension that are known from the tag image associated with the second dimension (as generated in the first scan pass described above) to have no failures need not be scanned, thereby saving processing time.

Figure 4:
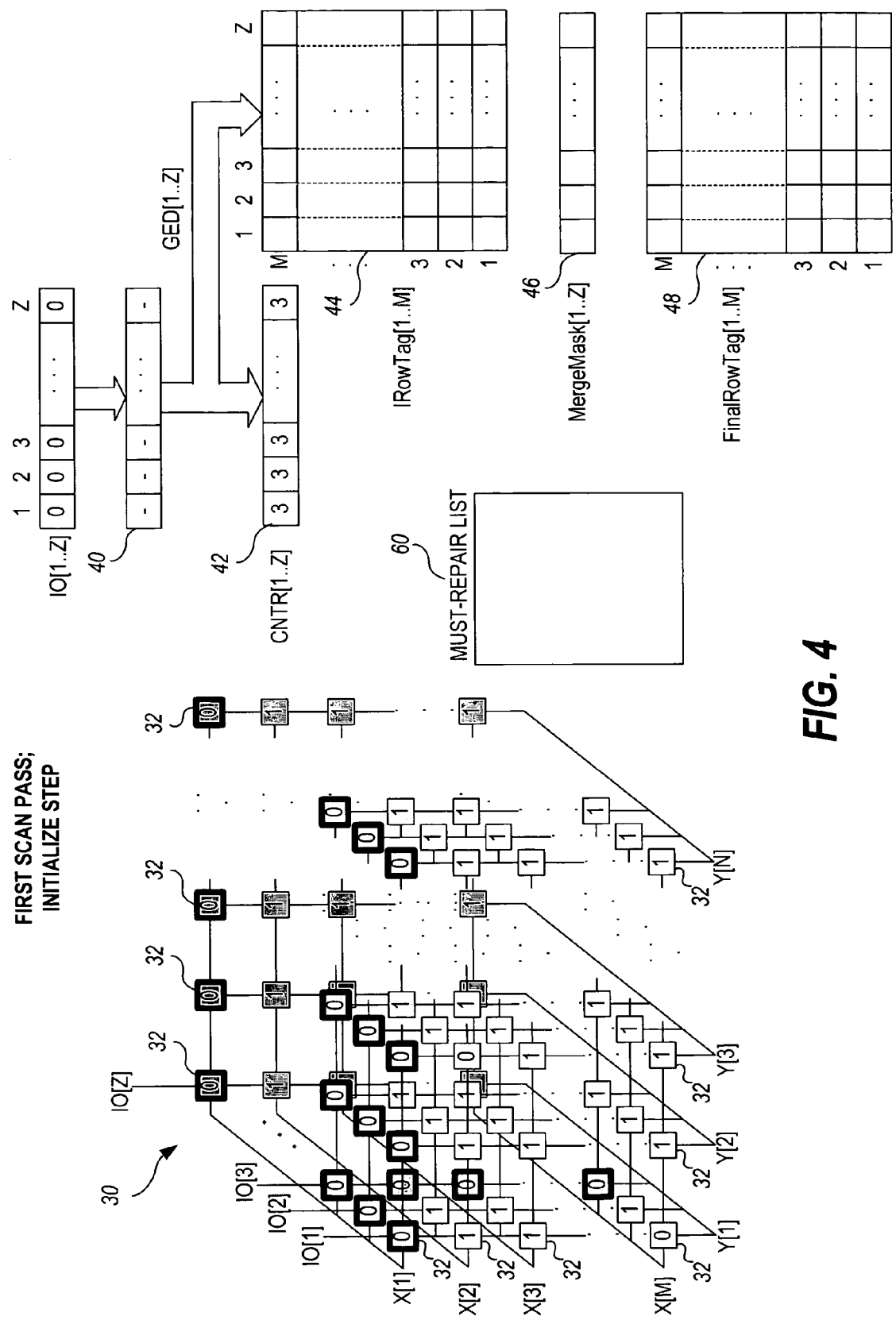
FIG. 4 is a block diagram of an exemplary memory test configuration for processing the error data image of FIG. 2B, illustrating a state of the memory test during a step of a first scan pass of the error data image.

Returning to FIG. 4 for a more detailed look at the operation of one embodiment, the column dimension is selected as a first dimension. The scanning algorithm sets up a number of counters 42. In one embodiment, there are Z counters, CNTR[1]-CNTR[Z], one each corresponding to one each of the IO bits IO[1]-IO[Z]. In another embodiment, discussed hereinafter, there may be one counter per predetermined number of IO bit groups. In one embodiment, the counters CNTR[1]-CNTR[Z] 42 are initialized to a maximum number of errors tolerated in a column before considering the column a must-repair column. The counters 42 are decremented (counted down) as failures are found in the selected column on the corresponding IO bits. For purposes of illustration, a given column may be considered a must-repair column if it contains three (3) or more errors. (In practice, this number will typically be higher). Thus, in the present example, the counters CNTR[1]-CNTR[Z] 42 may be each initialized to a value of "3", as shown in FIG. 4.

In one embodiment, a grouping configuration function 40 may allow groups of IO bits to be treated as one bit for the purposes of counting failures. For example, in one embodiment, the grouping mechanism 40 comprises a grouping mask (not shown, but discussed with respect to FIG. 20) corresponding to each counter 42. Each grouping mask comprises one bit per IO bit. Each bit in a given grouping mask may be "set" to assign the corresponding IO bit to a group assigned to a corresponding counter 42. Each bit in a given grouping mask may be "cleared" if the corresponding IO bit is not a member of the group assigned to the corresponding counter 42. IO bits whose corresponding bit in the grouping mask is cleared are ignored by the corresponding counter 42. Corresponding logic (not shown, but discussed with respect to FIG. 20) operates to advance the counter 42 corresponding to a given group if a failure is detected on any one or more of the IO bits assigned to the given group.

Figure 5:
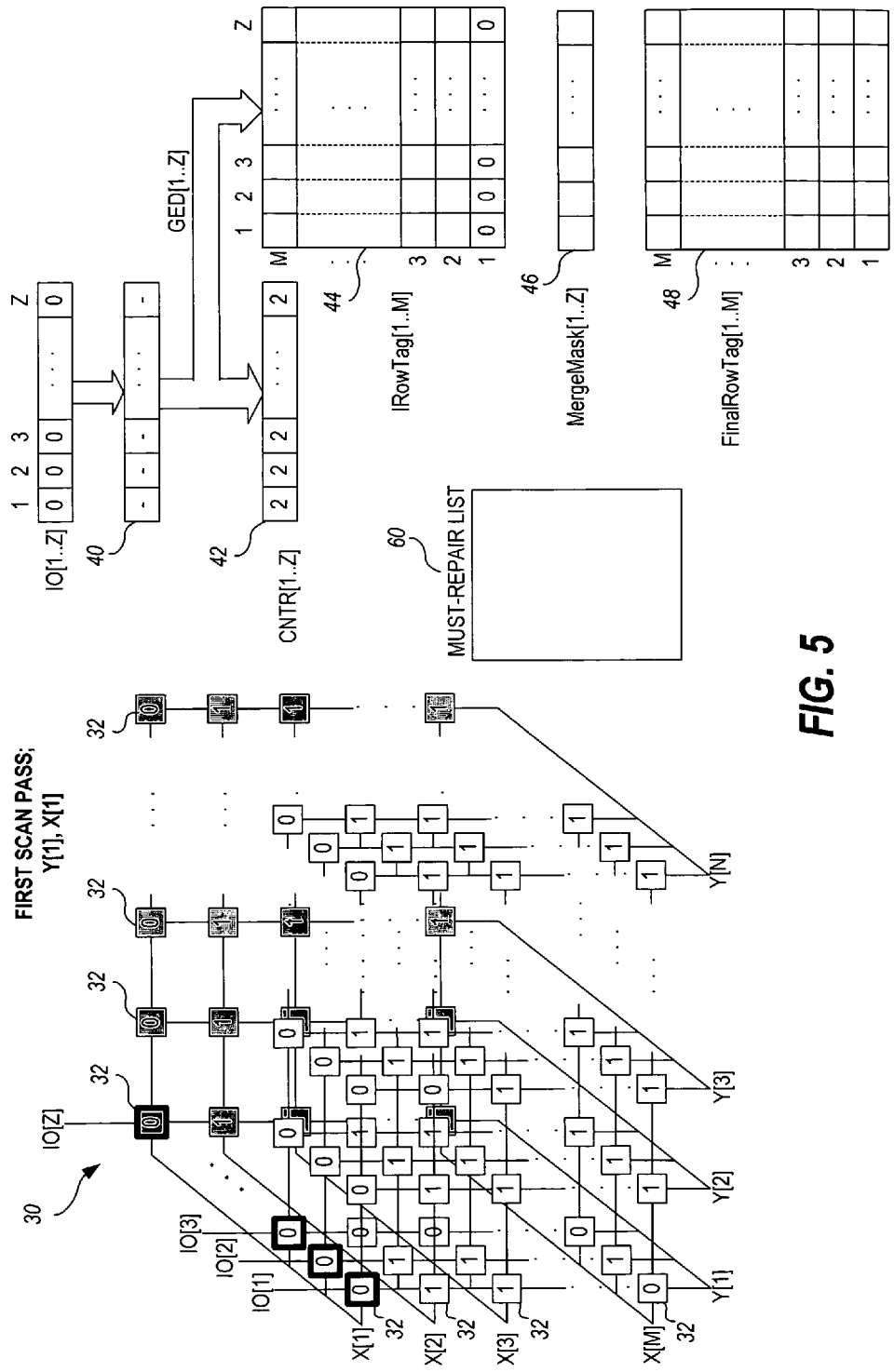
FIG. 5 is a block diagram of an exemplary memory test configuration for processing the error data image of FIG. 2B, illustrating a state of the memory test during a step of a first scan pass of the error data image.

Each column Y[1]-Y[N] is then scanned for errors. In one embodiment, a first column Y[1] is selected and the error data for the first element X[1] in that column is accessed, as illustrated in FIG. 5. As shown, the error data IO[1 . . . Z] for addressed column Y[1] and addressed row X[1] has a value of "000 . . . 0". For each row address in each column, the error data stored in the error data image 30 at the specified address is obtained. In one embodiment, the bits of the error data IO[1 . . . Z] may be grouped according to the grouping configuration as set up in the grouping configuration function 40. For the present example, it will be assumed that no IO bit grouping is set up. Accordingly, in this example there is one counter 42 corresponding to each group of one IO bit.

The grouped error data GED[1 . . . Z] is then temporarily stored, in one embodiment, in what is referred to herein as an intermediate row tag IRowTag 44. The intermediate row tag IRowTag 44 stores one column full of grouped error data GED[1 . . . Z]. Thus, in one embodiment of the example of FIG. 5, the intermediate row tag IRowTag 44 is one column by M rows by Z bits. The error data for column Y[1], row[1] is shown temporarily stored at row 1 of the intermediate row tag IRowTag 44.

Because the grouped error data GED[1 . . . Z] includes bits (IO[1], IO[2], IO[3], and IO[Z]) that have failures, each of the counters CNTR[1], CNTR[2], CNTR[3], and CNTR[Z] corresponding to the IO bits IO[1], IO[2], IO[3], and IO[Z] are decremented, thereby temporarily recording the cumulative number of corresponding failures seen so far on those respective bits IO[1], IO[2], IO[3], and IO[Z] for the current column Y[1].

Figure 6:
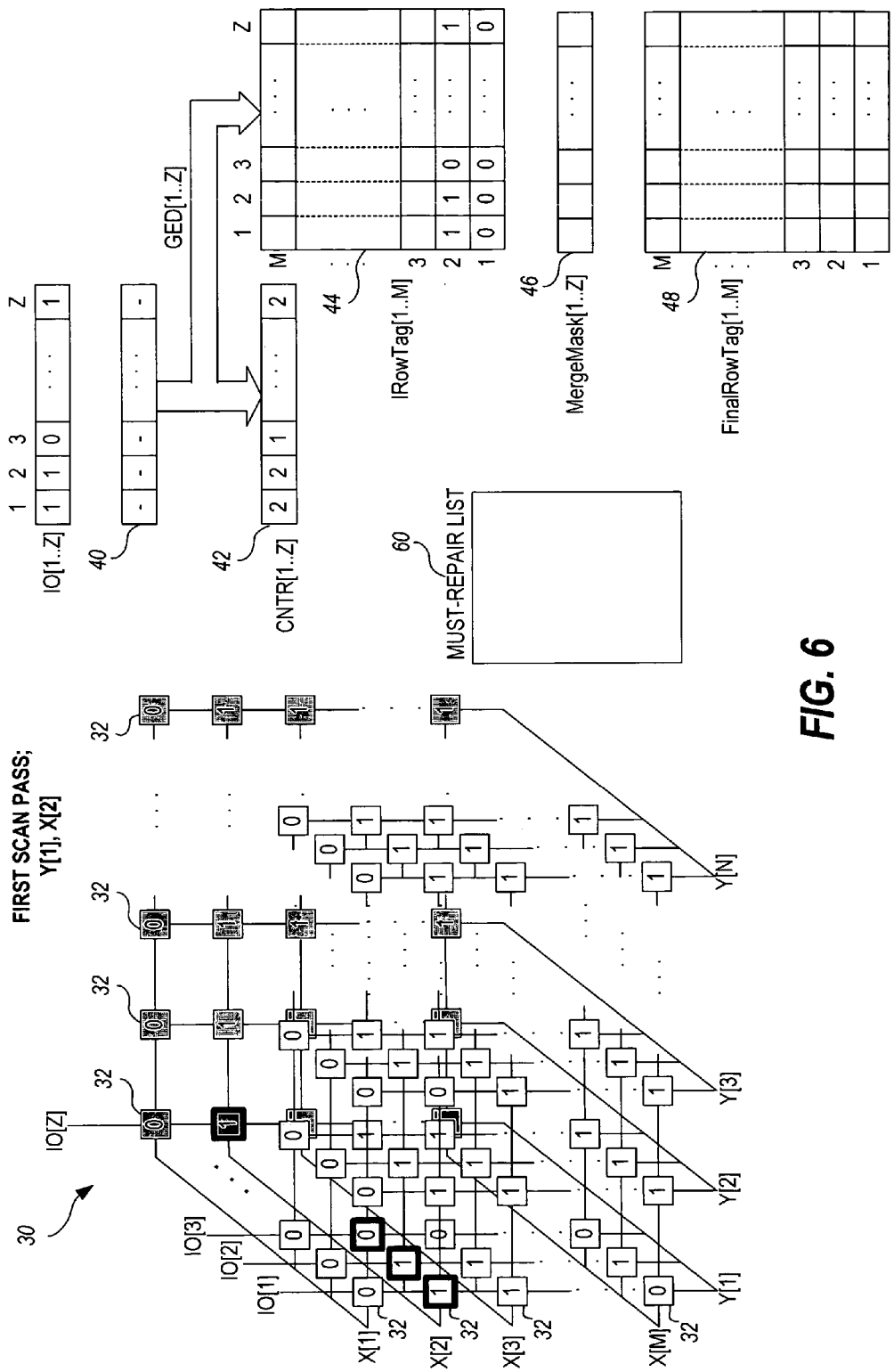
FIG. 6 is a block diagram of an exemplary memory test configuration for processing the error data image of FIG. 2B, illustrating a state of the memory test during a step of a first scan pass of the error data image.

The next element X[2] in selected first column Y[1] is then accessed, as illustrated in FIG. 6. As shown, the error data IO[1 . . . Z] for addressed column Y[1] and addressed row X[2] has a value of "110 . . . 1". Because in the present example no grouping configuration is set, there is a one-to-one correspondence between the IO bits and counters 42. The grouped error data GED[1 . . . Z] is temporarily stored. In one embodiment, the grouped error data GED[1 . . . Z] is stored at row 2 of the intermediate row tag IRowTag 44.

Because bit 2 (IO[2]) of the grouped error data GED[1 . . . Z] has a failure, the corresponding counter CNTR[2] is decremented, thereby temporarily recording the cumulative number of corresponding failures seen so far on the respective bit lines for the current column.

Figure 7:
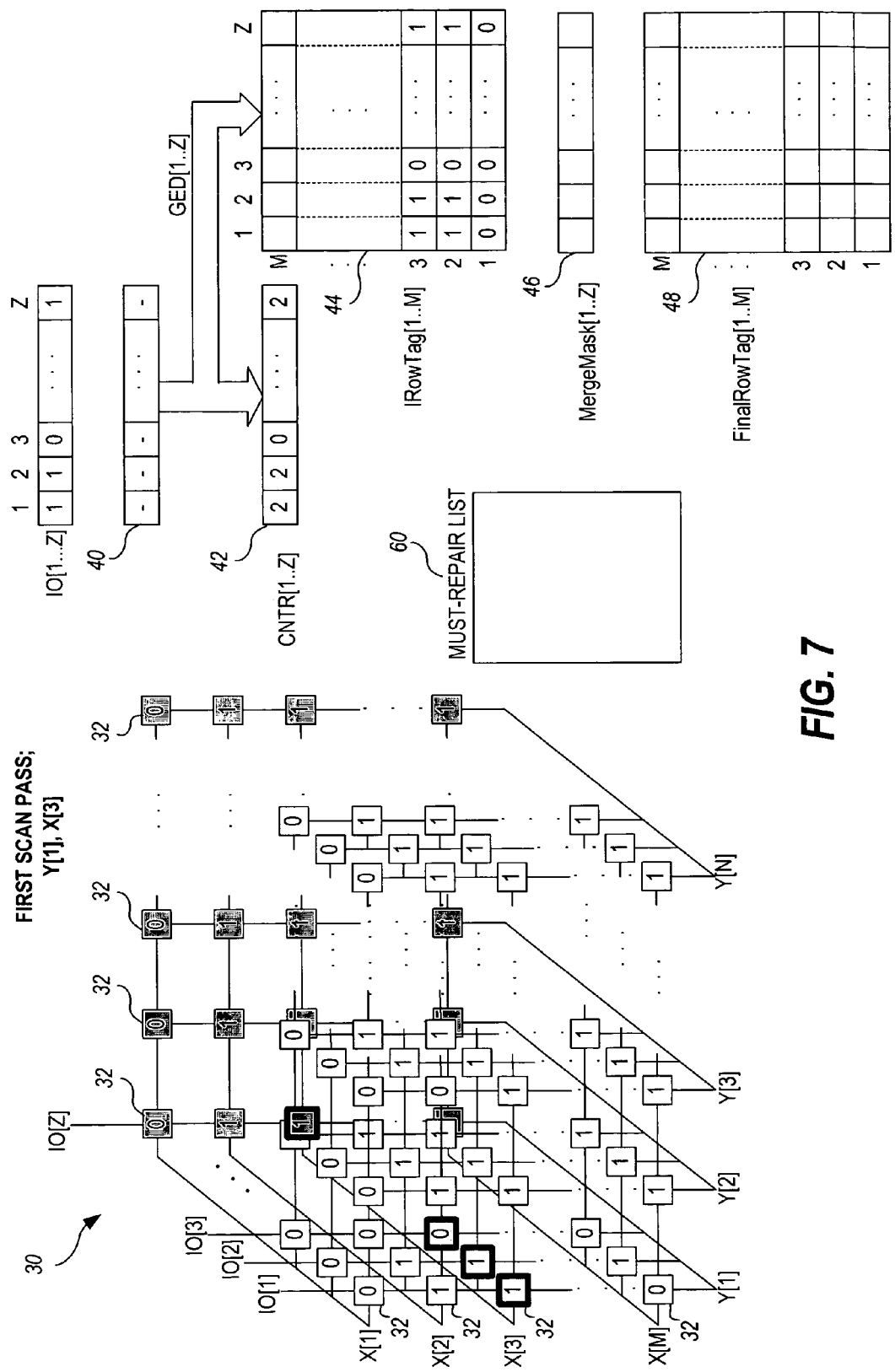
FIG. 7 is a block diagram of an exemplary memory test configuration for processing the error data image of FIG. 2B, illustrating a state of the memory test during a step of a first scan pass of the error data image.

The next element X[3] in selected first column Y[1] is then accessed, as illustrated in FIG. 7. As shown, the error data IO[1 . . . Z] for addressed column Y[1] and addressed row X[3] has a value of "110 . . . 1". The grouped error data GED[1 . . . Z] is temporarily stored. In one embodiment, the error data is stored at row 3 of the intermediate row tag IRowTag 44.

Because bit 3 (IO[3]) of the grouped error data GED[1 . . . Z] has a failure, the corresponding counter CNTR[3] is decremented, thereby temporarily recording the cumulative number of corresponding failures seen so far on the respective bit lines for the current column.

Figure 8:
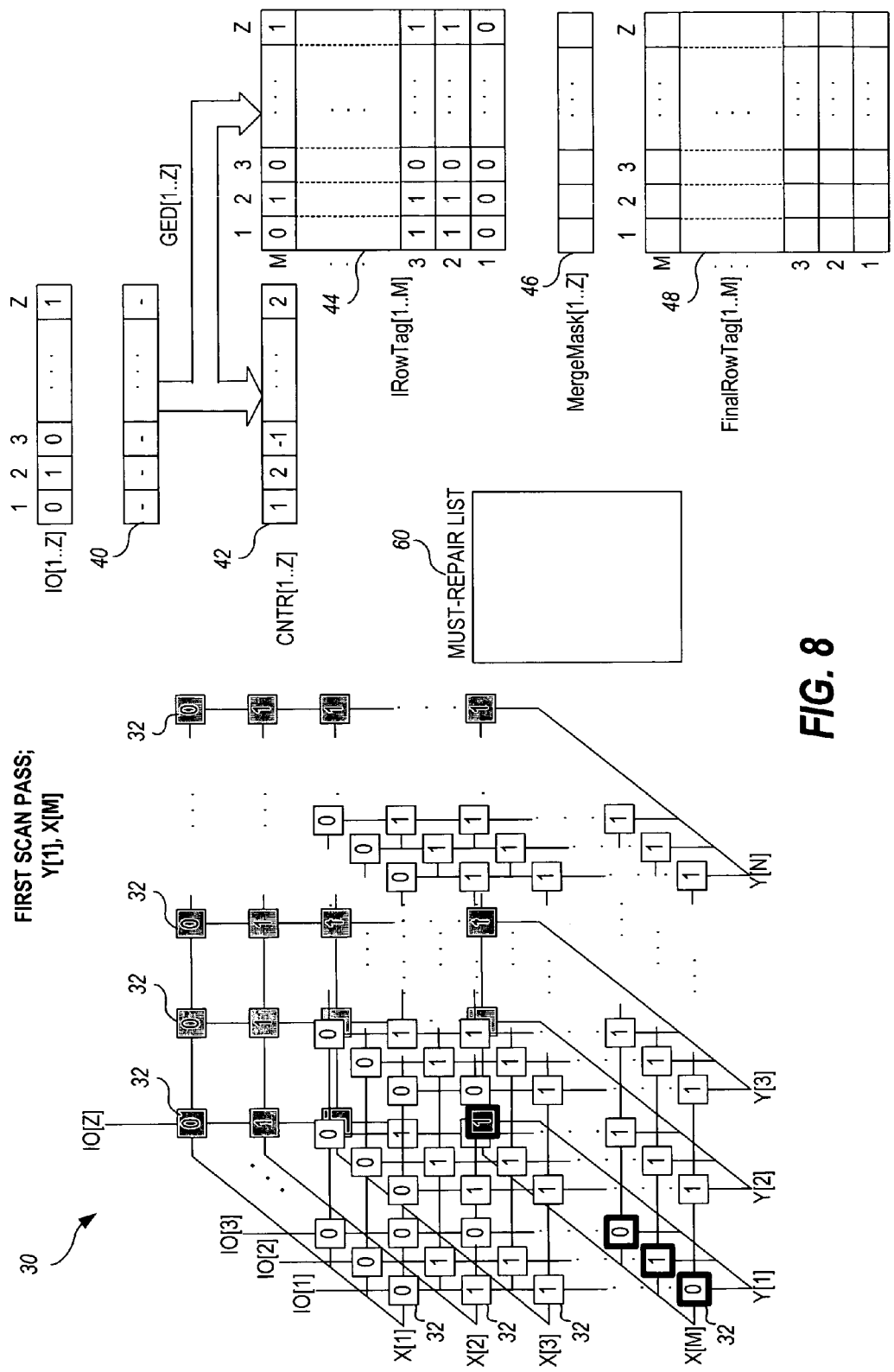
FIG. 8 is a block diagram of an exemplary memory test configuration for processing the error data image of FIG. 2B, illustrating a state of the memory test during a step of a first scan pass of the error data image.

Additional elements in the selected first column Y[1] are similarly accessed and processed until the last element X[M] is accessed, as illustrated in FIG. 8. As shown, the error data IO[1 . . . Z] for addressed column Y[1] and addressed row X[M] has a value of "010 . . . 1". The grouped error data GED[1 . . . Z] is temporarily stored. In one embodiment, the grouped error data GED[1 . . . Z] is stored at row M of the intermediate row tag IRowTag 44.

Because bit Z (IO[Z]) of the grouped error data GED[1 . . . Z] has a failure, the corresponding counter CNTR[Z] is decremented, thereby temporarily recording the cumulative number of corresponding failures seen so far on the respective bit lines for the current column.

Figure 9:
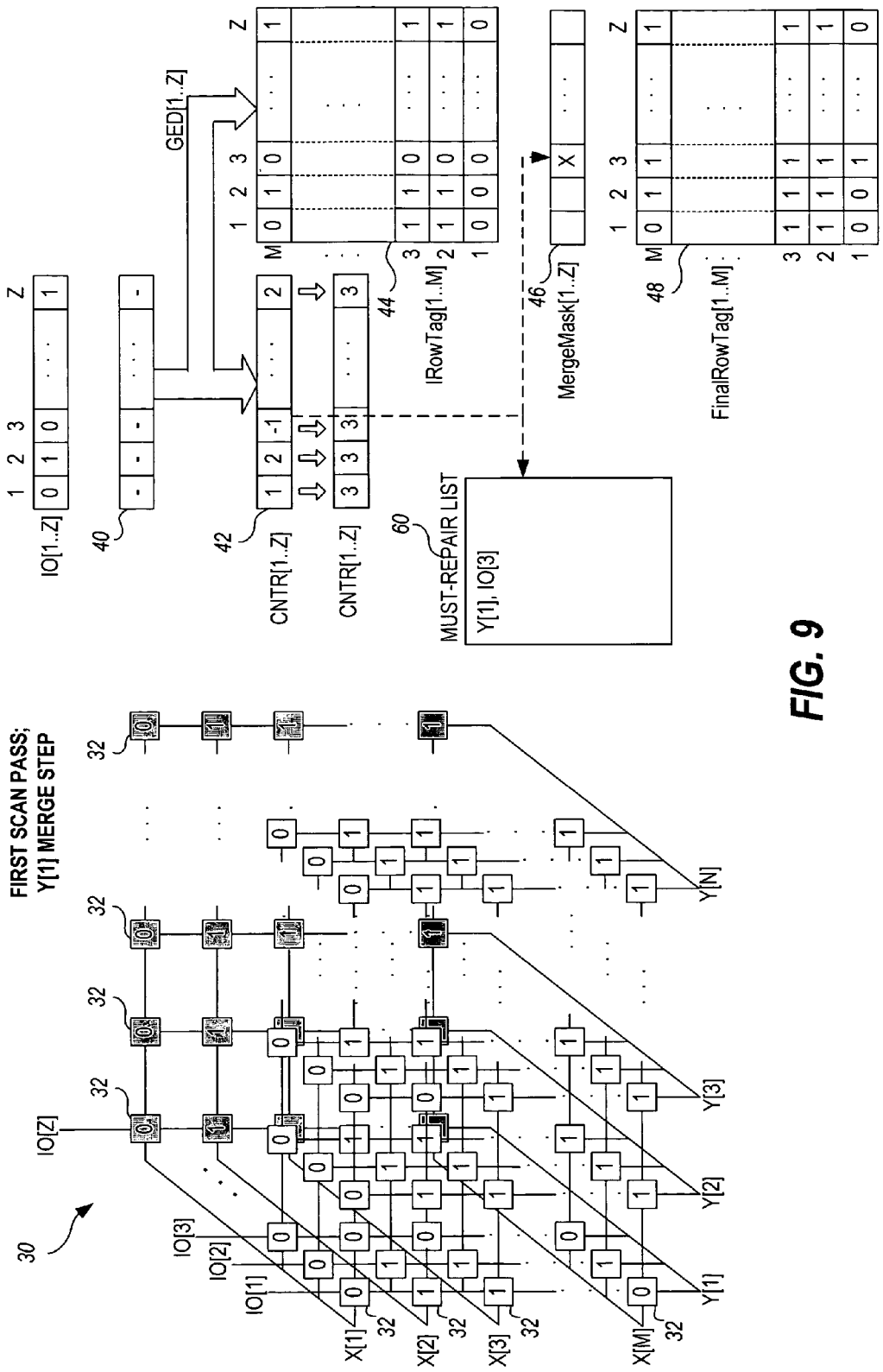
FIG. 9 is a block diagram of an exemplary memory test configuration for processing the error data image of FIG. 2B, illustrating a state of the memory test during a step of a first scan pass of the error data image.
Figure 10:
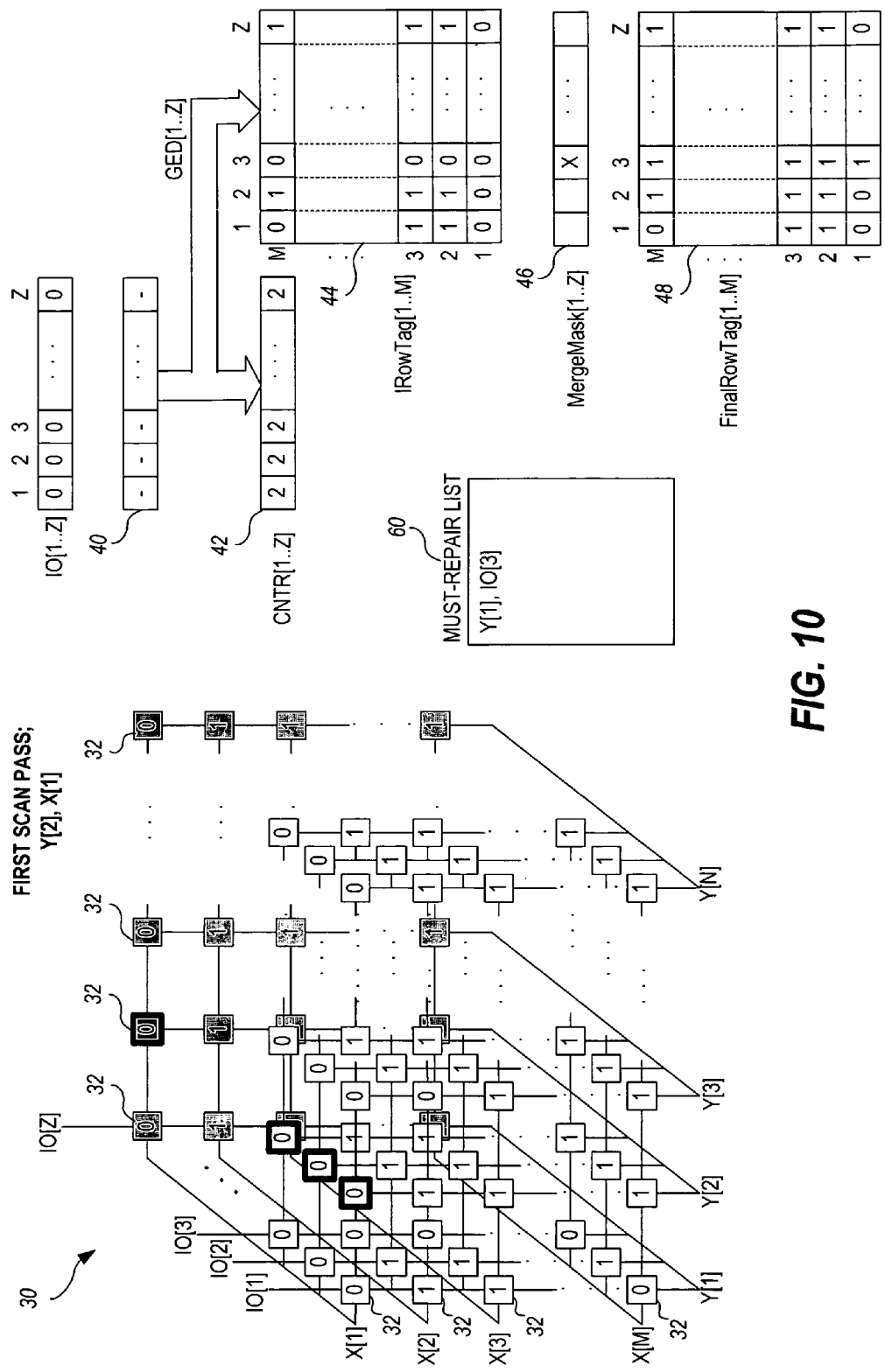
FIG. 10 is a block diagram of an exemplary memory test configuration for processing the error data image of FIG. 2B, illustrating a state of the memory test during a step of a first scan pass of the error data image.

When the error data has been obtained for each element in the Y[1] column, as illustrated in FIG. 9, the counters CNTR[1]-CNTR[Z] 42 associated with each of the IO bits IO[1]-IO[Z] are examined. Any counter 42 whose final count value has not changed from its initialized value indicates that no errors were seen on the corresponding IO bit of the currently selected column Y[1]. In the present example, this does not apply to any of the counters 42 associated with IO bits for column Y[1].

Any counter 42 whose final count value has counted at least the predetermined maximum value of errors tolerated in any column (in this example, counted down from "3" to "0" (or less)) indicates that the currently selected column Y[1] on the corresponding IO bit must be repaired with a redundant column. In the present example, the counter CNTR[2] associated with IO bit IO[2] has counted down the predetermined maximum value of errors tolerated before a column is a must-repair column. Accordingly, the currently selected column Y[1] and IO bit position IO[2] of the failed column is recorded in a failed location list. The corresponding bit MergeMask[2] in a merge mask register MergeMask[1 . . . Z] 46 is updated to mask (ignore) failures seen on IO bit IO[2] for the current column Y[1] while merging the data from the intermediate Row Tag 44 into the Final Row Tag 48.

The remaining counters CNTR[1], CNTR[3], CNTR[Z], whose final count value "2" indicates the existence of at least some failures but not the maximum tolerated number of failures (i.e., the existence of sparse failure(s)) in the column Y[1] in each of the corresponding IO bits. The corresponding bits MergeMask[1], MergeMask[3], MergeMask[Z] in MergeMask[1 . . . Z] 46 are updated to not mask (not ignore) failures seen on IO bits IO[1], IO[3], IO[Z] for the current column Y[1] while merging the data from the intermediate Row Tag into the Final Row Tag.

Once the merge mask register MergeMask 46 is fully updated to reflect the information revealed by the counters 42 for the currently selected column Y[1], each entry in the intermediate row tag IRowTag 44 is merged into a final row tag FinalRowTag[1 . . . M] 48 by combining the contents of the corresponding intermediate row tag entry with the mask data contained in the merge mask MergeMask 46. Thus, in the present example, a mask only on MergeMask[3] is applied to mask (ignore) any failures seen on IO bit 3 (IO[3]) prior to adding the cumulative effects of the intermediate row tag entry into the final row tag 48.

The above steps are repeated for each column that belongs to the selected set of addresses. For example, in FIG. 10, the counters 42 are reset to the predetermined maximum value, and the next column, Y[2], is selected. The error data for the first element X[1] in column Y[2] is accessed, as illustrated. As shown, the error data IO[1 . . . Z] for addressed column Y[2] and addressed row X[1] has a value of "000 . . . 0". The grouped error data GED[1 . . . Z] is temporarily stored at row 1 of the intermediate row tag IRowTag 44.

Because the grouped error data GED[1 . . . Z] includes bits (IO[1], IO[2], IO[3], and IO[Z]) that have failures, each of the counters CNTR[1], CNTR[2], CNTR[3], and CNTR[Z] corresponding to the IO bits IO[1], IO[2],IO[3], and IO[Z] are decremented, thereby temporarily recording the cumulative number of corresponding failures seen so far on those respective bit lines for the current column Y[2].

Figure 11:
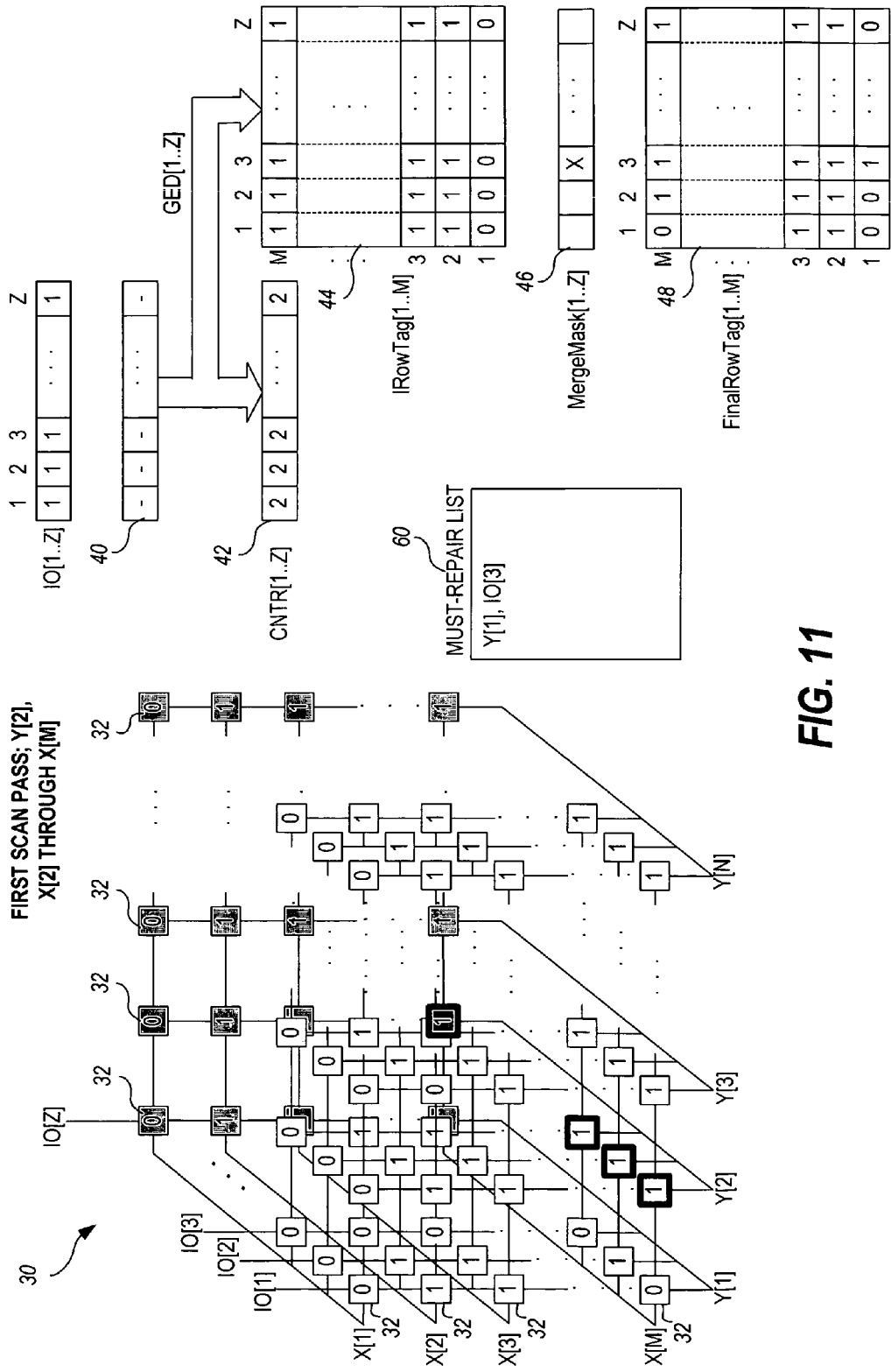
FIG. 11 is a block diagram of an exemplary memory test configuration for processing the error data image of FIG. 2B, illustrating a state of the memory test during a step of a first scan pass of the error data image.

The next elements X[2], X[3], . . . , X[M] in selected column Y[2] are then each accessed, as illustrated in FIG. 11, none of which contain any failures, resulting in the completed intermediate row tag IRowTag 44. When the error data has been obtained for each of the elements in the Y[2] column, the counters CNTR[1]-CNTR[Z] associated with each of the IO bits IO[1]-IO[Z] are examined as before, and the merge mask register MergeMask 46 is updated. In the present example, the resulting merge mask register MergeMask 46 does not mask any bits since none of the counters 42 expired during this iteration. Each entry in the intermediate row tag IRowTag 44 is then merged into the final row tag 48 as described previously, in this iteration without any required masking by the merge mask register MergeMask 46.

Figure 12:
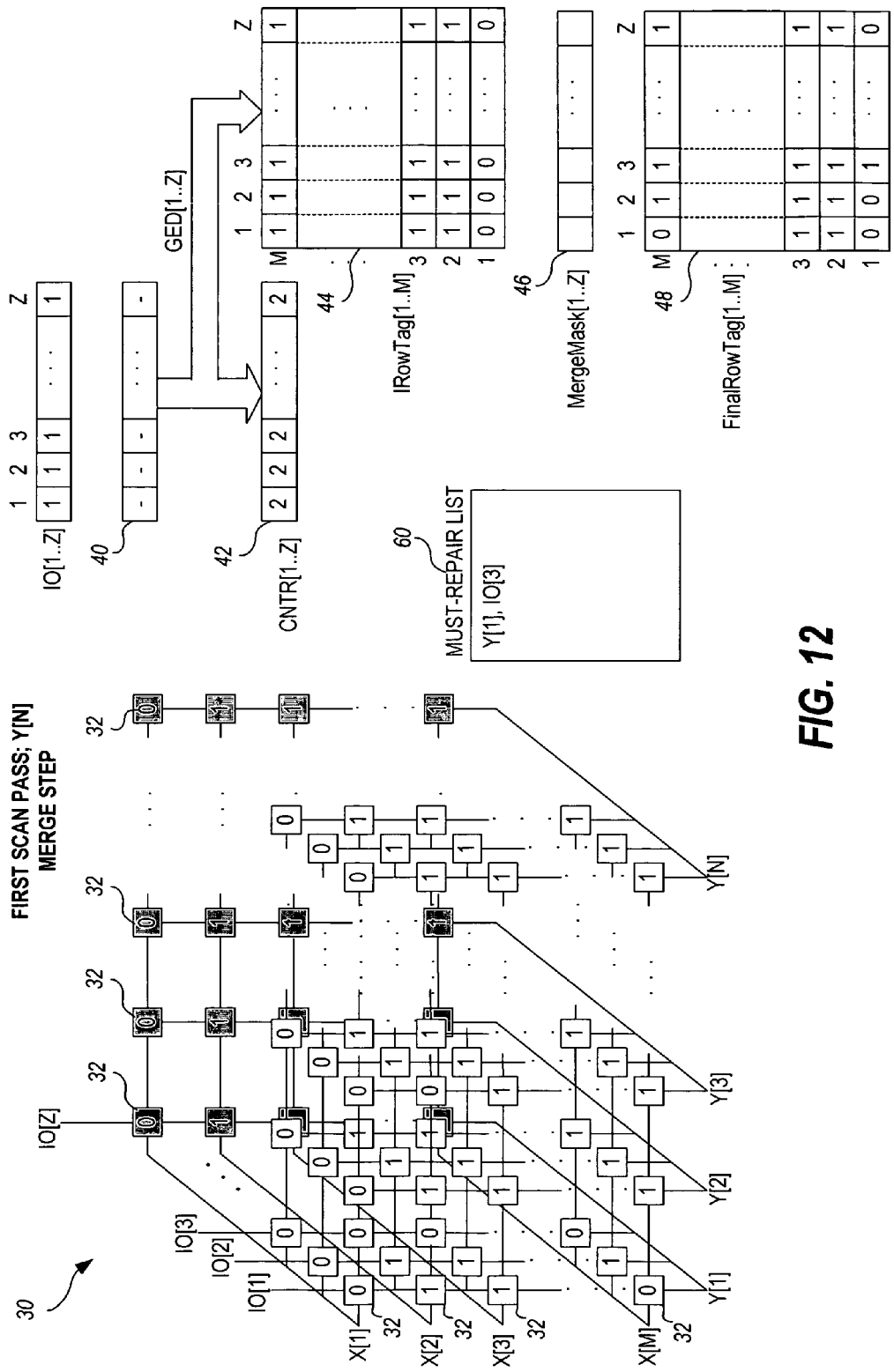
FIG. 12 is a block diagram of an exemplary memory test configuration for processing the error data image of FIG. 2B, illustrating a state of the memory test during a step of a first scan pass of the error data image.

The next column Y[3] and succeeding columns Y[N] are similarly processed, resulting in the final row tag FinalRowTag 48 shown in FIG. 12. As indicated by the final row tag image FinalRowTag 48, memory device 20 has sparse failures in memory cells 22 that correspond to IO bits IO[1]-IO[Z] (except IO[3]) of row X[1], and IO bit IO[0] of row X[M]. IO[3] of row X[1] shows no errors because the only errors on IO[3] of row X[1] have already been identified as must-repair, and hence they are not sparse. Rows X[2] and X[3] have no failures in any of the columns Y[1] through Y[N].

A column tag is then generated by scanning through the rows. However, since the final row tag FinalRowTag 48 indicates that certain rows (for example, rows X[2] and X[3]) have no failures in any of the columns Y[1] through Y[N], these rows need not be scanned, thereby saving processing time. The final column tag FinalColTag 58 is generated in the same way that the final row tag FinalRowTag 48 is generated, except that rows are scanned rather than columns scanned as in the first pass.

Figure 13:
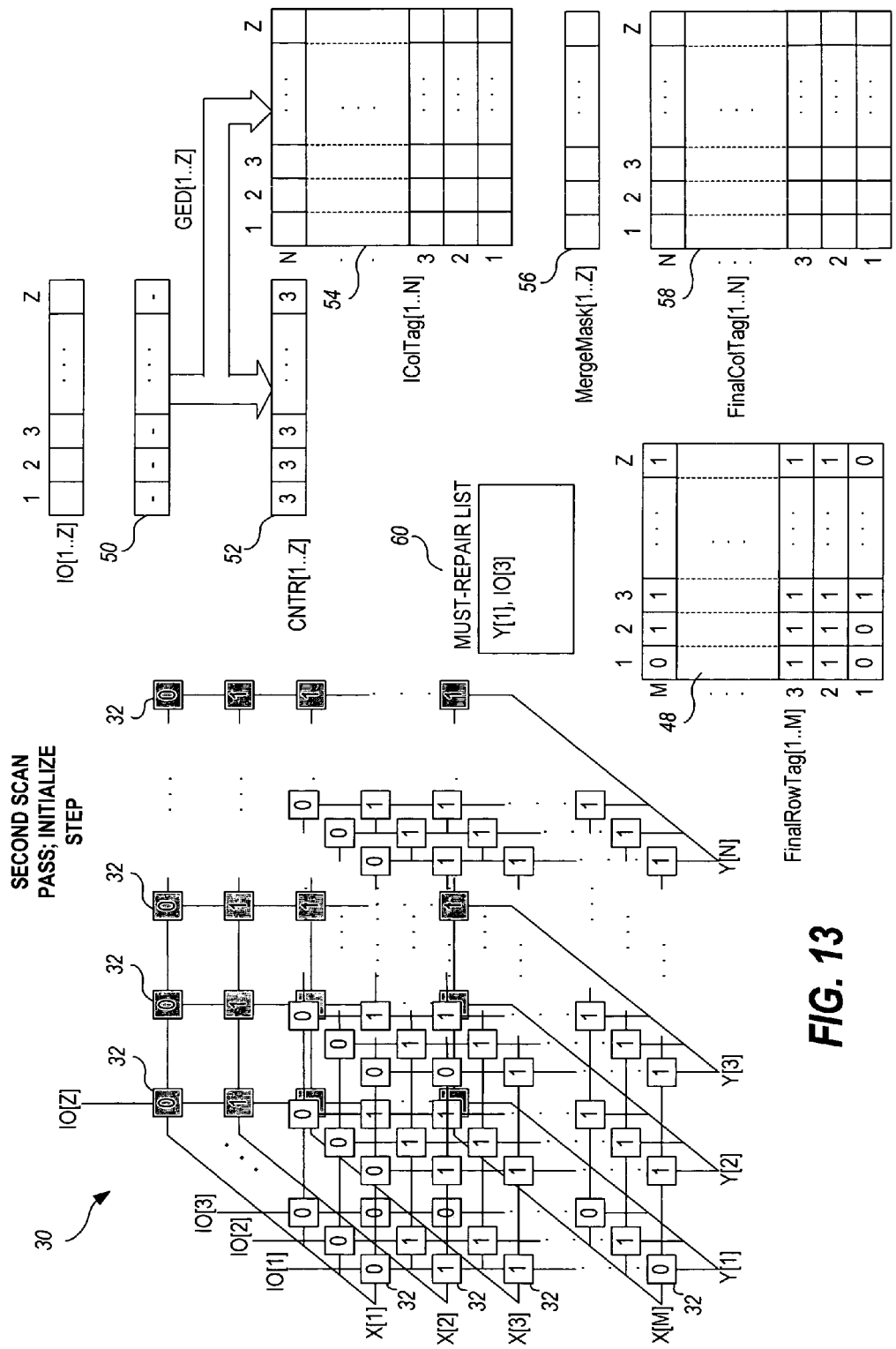
FIG. 13 is a block diagram of an exemplary memory test configuration for processing the error data image of FIG. 2B, illustrating a state of the memory test during a step of a second scan pass of the error data image.

Returning to the present example, FIG. 13 shows the initialization of the second pass. The scanning algorithm sets up a number of counters Counters[1 . . . Z] 52. In one embodiment, there are Z counters, CNTR[1]-CNTR[Z], one each corresponding to one each of the IO bits IO[1]-IO[Z]. In another embodiment, discussed hereinafter, there may be one counter per predetermined number of IO bit groups. In one embodiment, the counters CNTR[1]-CNTR[Z] 52 are initialized to a maximum number of errors tolerated in a row before considering the row a must-repair row, and the counters 52 are decremented (counted down) as failures are found in the selected row on the corresponding IO bits. For purposes of illustration, a given row is considered a must-repair row if it contains three (3) or more errors. (In practice, this number will typically be higher). Thus, in the present example, the counters CNTR[1]-CNTR[Z] 52 are each initialized to a value of "3".

In one embodiment, the grouping configuration function 40 may allow groups of IO bits to be treated as one bit for the purposes of counting failures.

Figure 14:
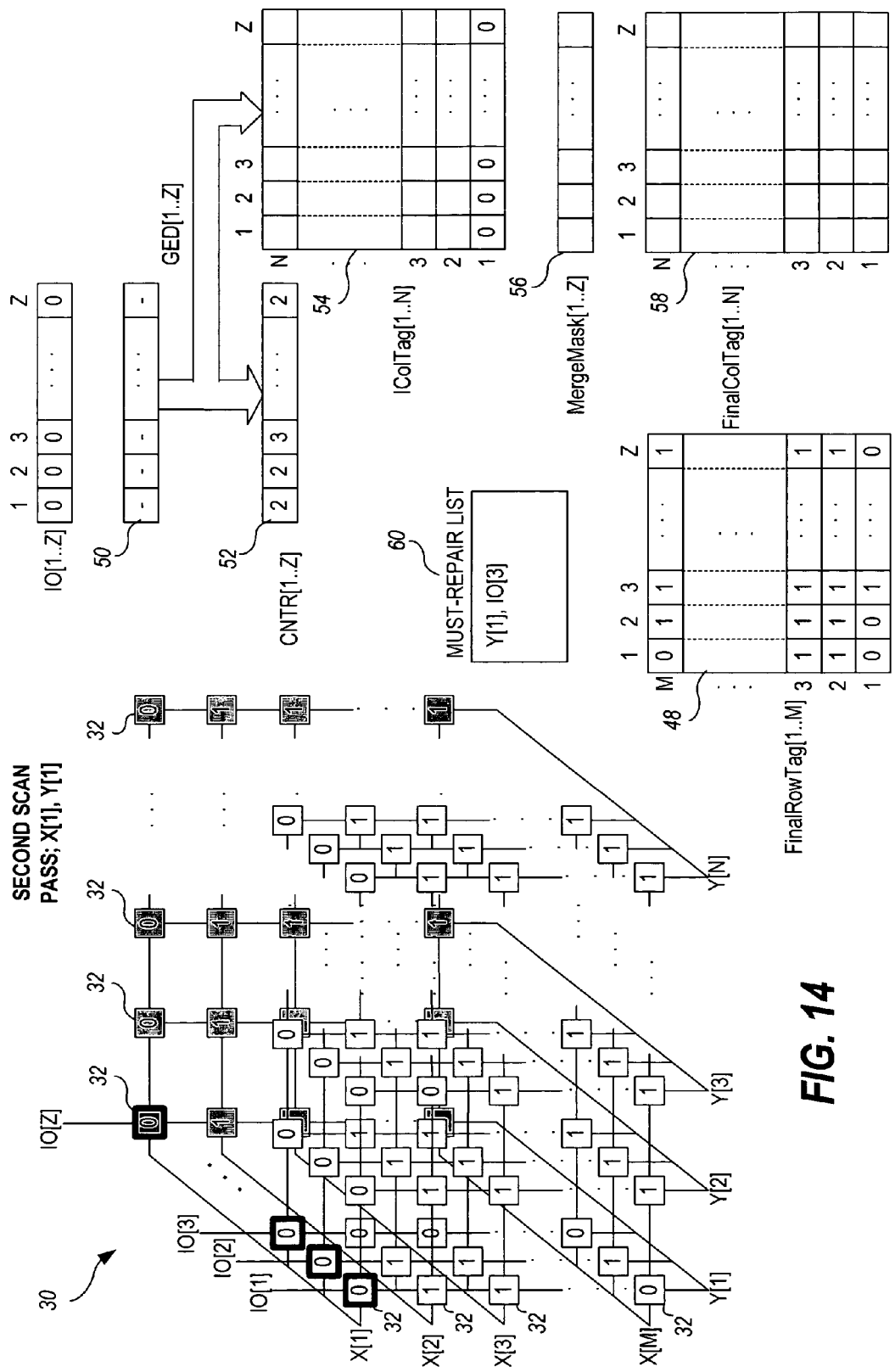
FIG. 14 is a block diagram of an exemplary memory test configuration for processing the error data image of FIG. 2B, illustrating a state of the memory test during a step of a second scan pass of the error data image.

Each row X[1]-X[M] is then scanned for errors. In one embodiment, a first row X[1] is selected and the error data for the first element Y[1] in that row is accessed, as illustrated in FIG. 14. For each column address in each row, the error data stored in the error data image 30 at the specified address is obtained. In one embodiment, the bits of the error data IO[1 . . . Z] may be grouped according to the grouping configuration as set up in the grouping configuration function 40. For the present example, it will be assumed that no IO bit grouping is set up. Accordingly, in this example there is one counter 42 corresponding to each group of one IO bit.

Referring again to FIG. 14, the error data IO[1 . . . Z] for addressed row X[1] and addressed column Y[1] is obtained and has a value of "000 . . . 0". The grouped error data GED[1 . . . Z] is temporarily stored. In one embodiment, the grouped error data GED[1 . . . Z] is stored in what is referred to herein as the intermediate column tag IColTag[1 . . . N] 54. The intermediate column tag 54 stores one row full of grouped error data GED[1 . . . Z]. Thus, in one embodiment of the example of FIG. 14, the intermediate column tag 54 is one row by N columns by Z bits. The grouped error data GED[1 . . . Z] for row X[1], column Y[1] is thus temporarily stored at row 1 IColTag[1] of the intermediate column tag 54.

Because the grouped error data GED[1 . . . Z] includes bits (IO[1], IO[2], IO[3], and IO[Z]) that have failures, each of the counters CNTR[1], CNTR[2], and CNTR[Z] 52 corresponding to the IO bits IO[1], IO[2], IO[3], and IO[Z] are decremented, thereby temporarily recording the cumulative number of corresponding failures seen so far on those respective bit lines for the currently selected row X[1].

Figure 15:
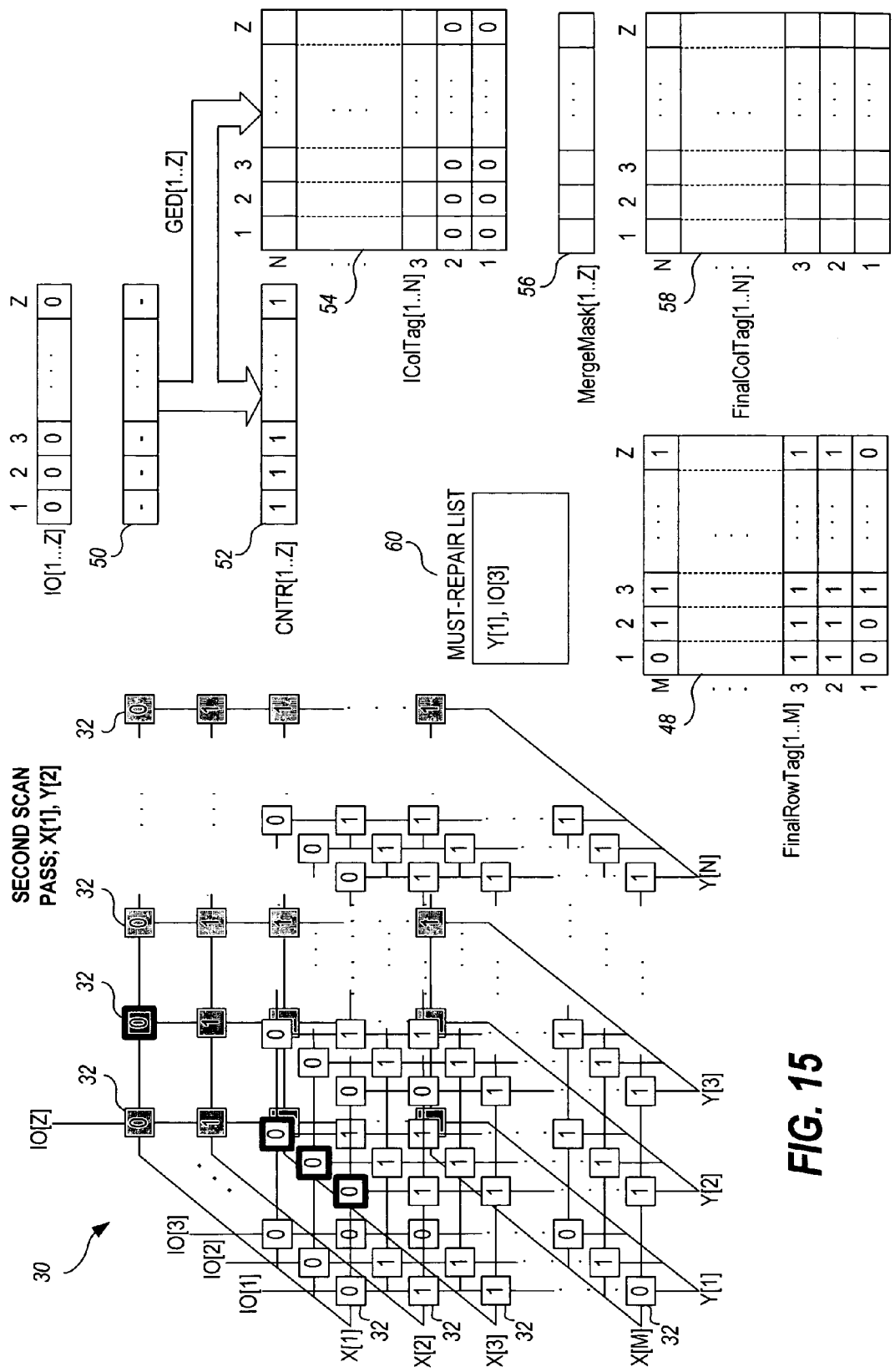
FIG. 15 is a block diagram of an exemplary memory test configuration for processing the error data image of FIG. 2B, illustrating a state of the memory test during a step of a second scan pass of the error data image.

The next element Y[2] in selected first row X[1] is then accessed, as illustrated in FIG. 15. As shown, the error data IO[1 . . . Z] for addressed row X[1] and addressed column Y[2] has a value of "000 . . . 0". In one embodiment, the grouped error data GED[1 . . . Z] is stored at row 2 of the intermediate column tag IColTag 54.

Because the grouped error data GED[1 . . . Z] includes bits (IO[1], IO[2], IO[3] and IO[Z]) that have failures, each of the counters CNTR[1], CNTR[2], CNTR[3], and CNTR[Z] corresponding to the IO bits IO[1], IO[2], IO[3], and IO[Z] are decremented, thereby temporarily recording the cumulative number of corresponding failures seen so far on those respective bit lines for the currently selected row X[1].

Figure 16:
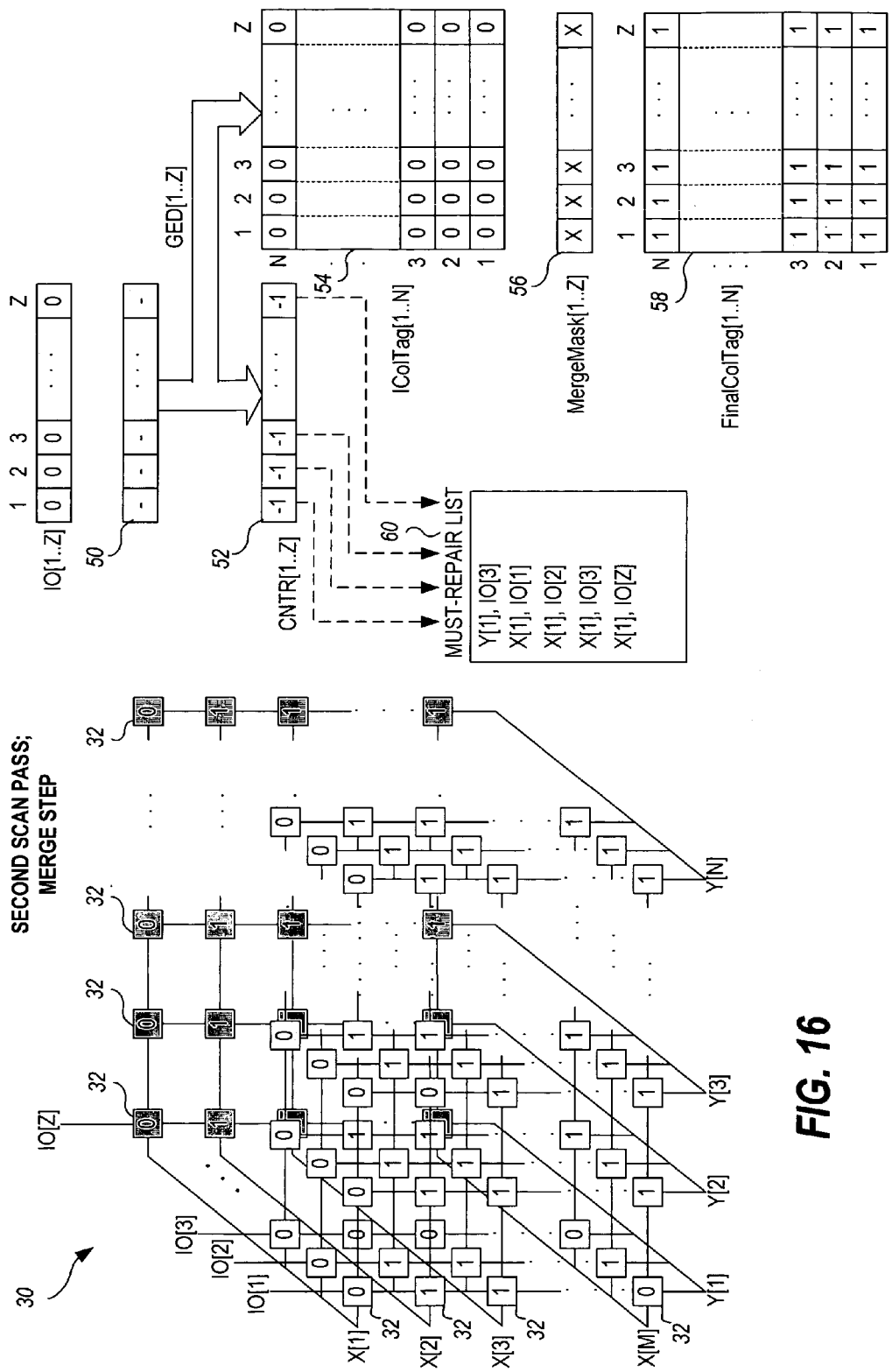
FIG. 16 is a block diagram of an exemplary memory test configuration for processing the error data image of FIG. 2B, illustrating a state of the memory test during a step of a second scan pass of the error data image.

The next elements Y[2], Y[3], . . . , Y[N] in selected first row X[1] are then accessed and similarly processed until all elements in row X[1] have been processed, as illustrated in FIG. 16. When the error data has been obtained for each column element in the row X[1], the counters CNTR[1]-CNTR[Z] associated with each of the IO bits IO[1]-IO[Z] associated with row X[1] of the memory device are examined. Any counter whose final count value has counted at least the predetermined maximum value of errors tolerated in any row (in this example, counted down from "3" to "0" (or less)) indicates that the particular row on the corresponding IO bit must be repaired with a redundant row. In the present example, all counters CNTR[1]-CNTR[Z] 52 have counted down the predetermined maximum value of errors tolerated before a row is considered a must-repair row. Accordingly, the currently selected row X[1] and IO bit position IO[1]-IO[Z] of the failed row is recorded in the fail list. The corresponding bits MergeMask[1]-MergeMask[Z] in the merge mask register 56 are updated to mask (ignore) failures seen on these IO bits IO[1]-IO[Z] for the current row X[1].

Once the merge mask register MergeMask 56 is fully updated to reflect the information revealed by the counters 52 for the current scanned row (X[1]), each entry in the intermediate column tag 54 is merged into the final column tag 58 as the masked intermediate column tag entry masked by the must-repair information contained in the merge mask 56. Thus, in the present example, since there is a mask on all bits in MergeMask 56, all failures on all bits get ignored for this row for purposes of adding the information to the cumulative column tag.

Figure 17:
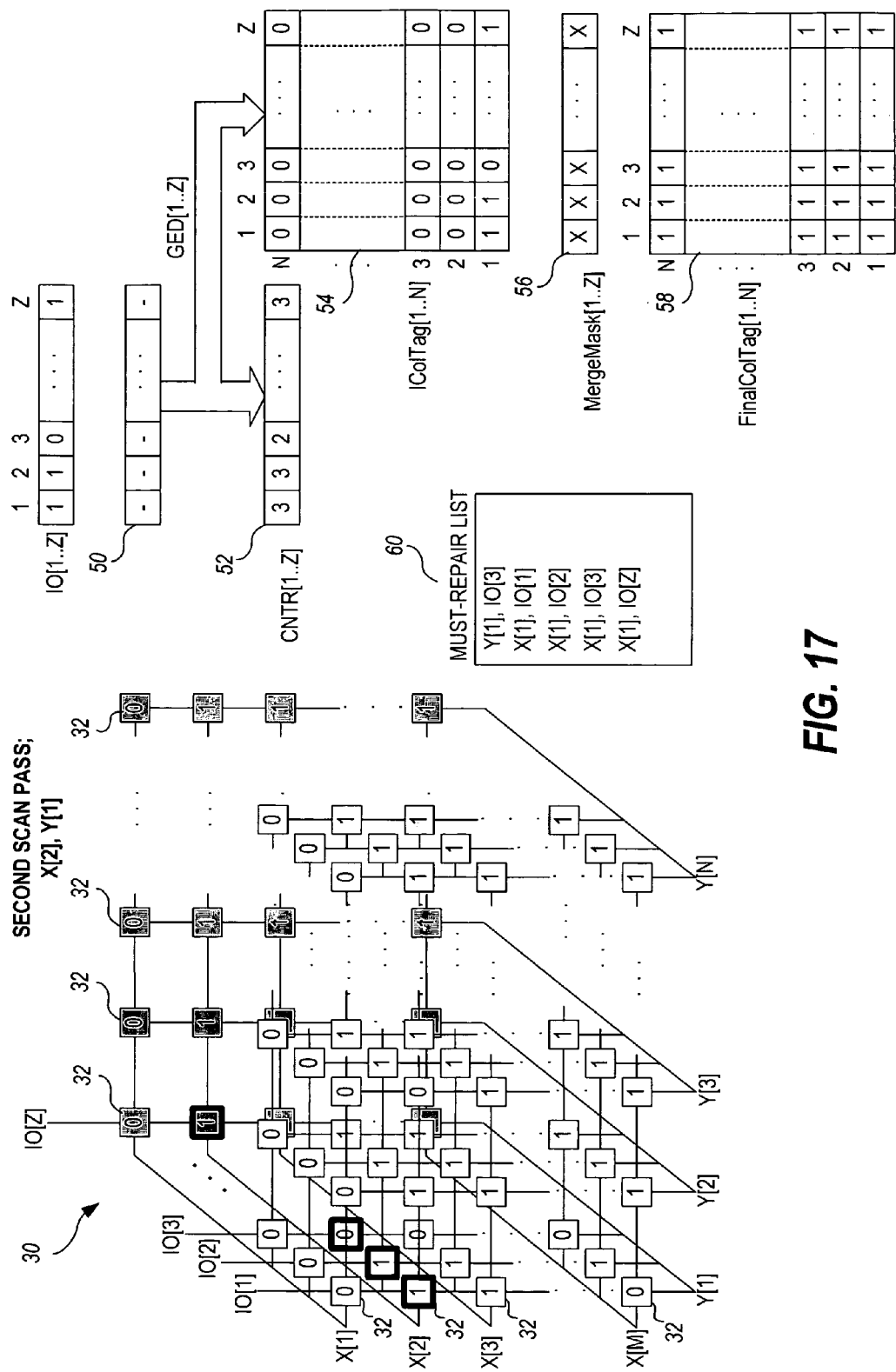
FIG. 17 is a block diagram of an exemplary memory test configuration for processing the error data image of FIG. 2B, illustrating a state of the memory test during a step of a second scan pass of the error data image.

In FIG. 17, the counters 52 are reset to the predetermined maximum value, and the next row, X[2], is selected. The error data for the first column element Y[1] in row X[2] is accessed, as illustrated. As shown, the error data IO[1 . . . Z] for addressed row X[2] and addressed column Y[1] has a value of "110 . . . 1". The grouped error data GED[1 . . . Z] is temporarily stored at entry 2 of the intermediate column tag 54.

Because the grouped error data GED[1 . . . Z] has a failure on IO bit IO[3], the corresponding counter CNTR[3] 52 is decremented.

Figure 18:
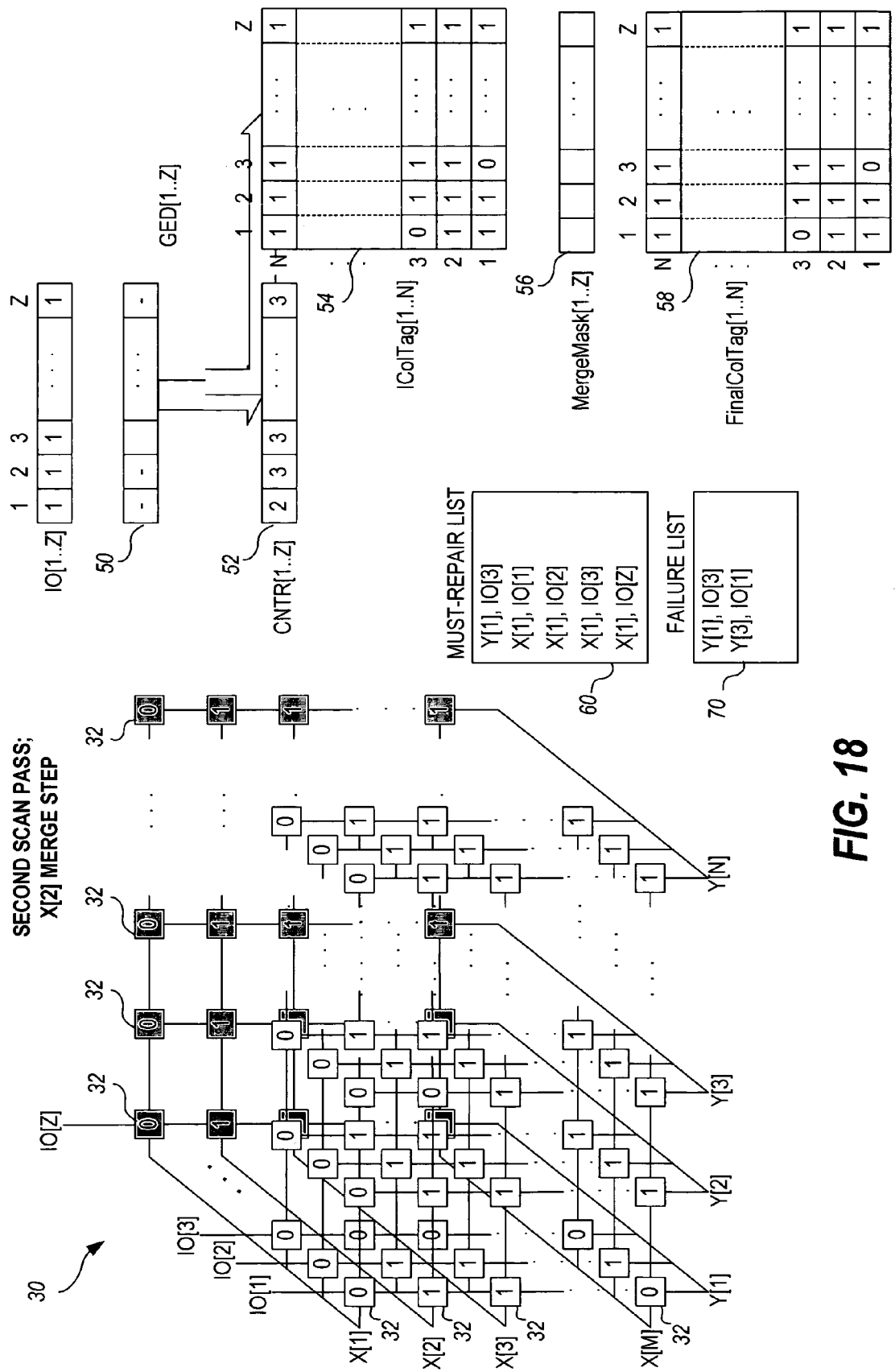
FIG. 18 is a block diagram of an exemplary memory test configuration for processing the error data image of FIG. 2B, illustrating a state of the memory test during a step of a second scan pass of the error data image.

The next column elements Y[2], Y[3], . . . , Y[N] in selected row[2] are then each accessed and processed, resulting in the intermediate column tag 54 illustrated in FIG. 18.

During the merge step in the second scan pass, any column with any fail that is not masked by the merge mask register MergeMask 52 is a sparse failure, and can be flagged as such or placed in a sparse failure list 70, as shown, saving steps later. Thus, in the example shown, since IColTag[1], bit 3 (corresponding to column Y[1], IO[3]) is not masked by the MergeMask[3] (due to its corresponding counter not decrementing to or past 0), the corresponding column and bit address Y[1], IO[3] may be entered into a failure list 70. Likewise, address Y[3], IO[1] is also added to the failure list 70. As shown from this example, failure data from the Must Repair list 60 (such as Y[1], IO[3]) may show up in the failure list 70, but may be easily removed to generate a sparse failure list 72 (for example by running a computerized filter program that removes any address from the failure list 70 that appears in the must-repair list).

Figure 19:
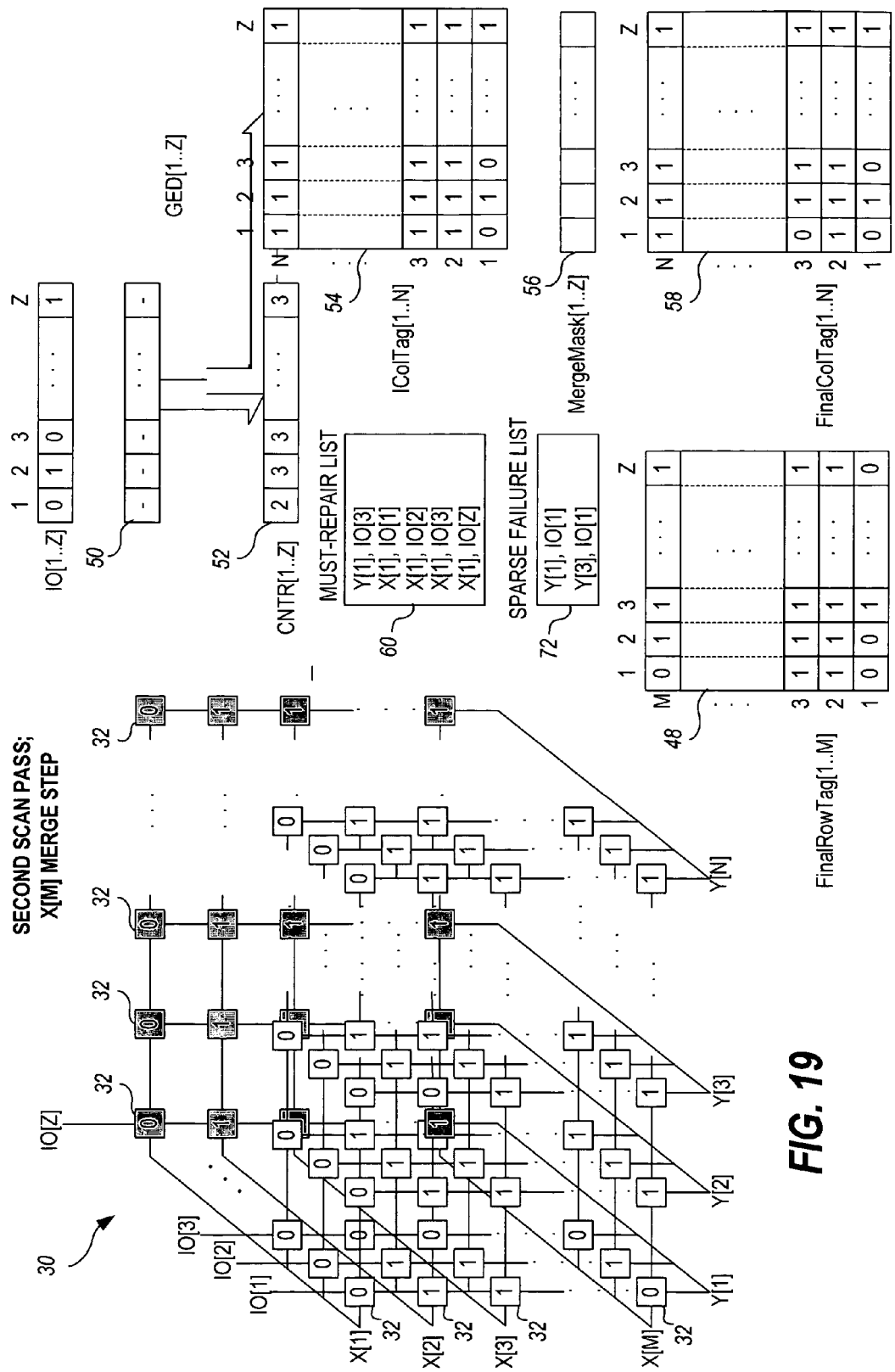
FIG. 19 is a block diagram of an exemplary memory test configuration for processing the error data image of FIG. 2B, illustrating a state of the memory test during a step of a second scan pass of the error data image.

The above steps are repeated for each remaining row that belongs to the selected set of addresses, resulting in the final column tag image 58 and failure list 70 shown in FIG. 19. As indicated by the final column tag image 58 and failure list 70, memory device 20 has failures in memory cells 22 that correspond to IO bit IO[1] and IO[3] of column Y[1], and IO[1] of column Y[3]. Removing the addresses in the failure list 70 that also appear in the must-repair list 60 yields the sparse failure list 72, shown in FIG. 19. The remaining columns have no failures in any of the IO bits (not counting the must repair columns and must repair rows listed in the fail list 60).

Thus, all of the interesting information, including locations of must repair rows and must repair columns and the locations of the remaining sparse failures, is recoverable from the error data image 30 in only two scan passes.

In one embodiment, redundant row elements replace not only a row for a single IO bit, but a row including all IO bits simultaneously. As a result, only a single counter is needed to generate the column tag, and the counter keeps track of the number of failures detected on any IO bit.

To continue with this example, suppose that the memory DUT 20 is an eight bit wide memory (Z=8) having internal X and Y address mechanisms. Internally the DUT 20 is organized as eight memory cells 22, each having the same X and Y addressing mechanisms, and each providing its output data to a different one of eight pins IO[1 . . . 8]. Suppose further that the DUT 20 is configured with redundant columns on a per-IO bit basis and with redundant rows that include all IO bits. The number of counters during the column scan pass would have to be equal to the number of IO bits (i.e., 8 counters), whereas, because redundant rows replace not only the row of one IO bit but the entire row across all IO bits, only one counter would be required during the row scan pass. This follows because regardless of the particular IO pin that a failure is detected on, the failure should be counted towards the replacement of the entire row.

Clearly, the opposite would apply if the memory DUT 20 is configured with redundant rows on a per-IO bit basis and redundant columns on a multiple-IO-bit basis.

Figure 20:
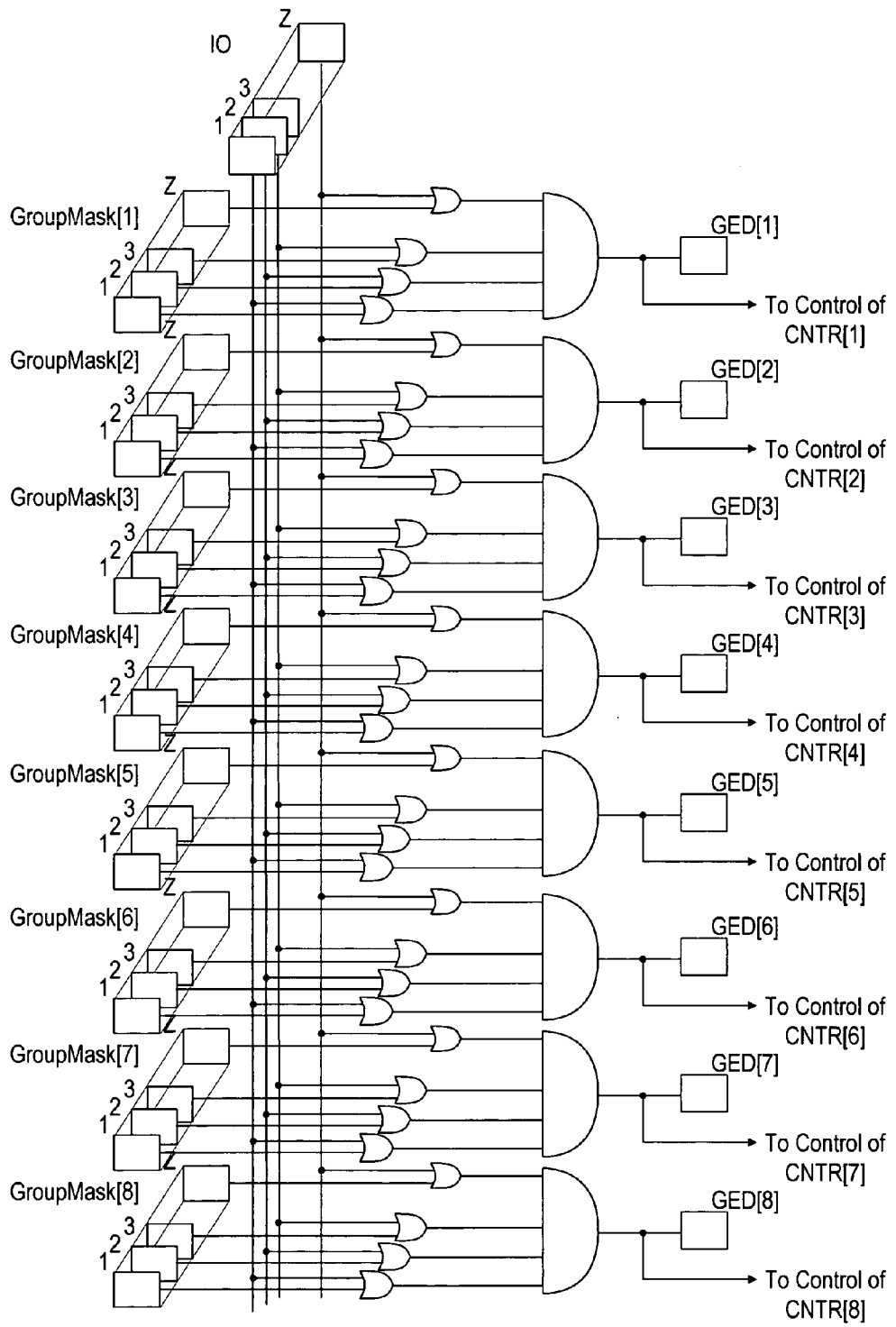
FIG. 20 is a block diagram illustrating a logic diagram of an exemplary embodiment of a grouping configuration function.

As previously discussed, there are situations when it would be desirable to count failures on any one or more of a group of IO bits as a single failure. The grouping configuration function 40 allows configuration of IO bit groups. FIG. 20 is a block diagram illustrating a logic diagram of an exemplary embodiment 200 of a grouping configuration function 40. The logic implementation of the embodiment of FIG. 20 assumes that a logical "0" corresponds to a fail of the corresponding IO bit and a logical "1" corresponds to a pass of the corresponding IO bit. The logic implementation of the embodiment of FIG. 20 also assumes that a logical "0" designates membership of the corresponding IO bit in a corresponding group, and a logical "1" designates exclusion of the corresponding IO bit from the corresponding group. For description of examples presented hereinafter, the embodiment also assumes the number of IO bits is "8" (i.e., Z=8).

As illustrated, grouping configuration function 200 includes group bitmasks GroupMask[1 . . . 8], one per counter CNTR[1 . . . 8] (not shown). Each group bitmask GroupMask[1] . . . GroupMask[8] includes eight bits, one each corresponding to one each of IO bits IO[1 . . . 8]. Any given group bitmask GroupMask[1] . . . GroupMask[8] may group any combination of the IO bits IO[1 . . . 8] by setting the corresponding bits in the group mask to a logical "0" to designate membership of the corresponding IO bit(s) in the group, and setting the corresponding bits in the group mask to a logical "1" to exclude the corresponding IO bit from the corresponding group. Each bit of each group mask GroupMask[1] . . . GroupMask[8] is logically ORed with the corresponding IO bit. The ORed data in each group is logically ANDed together to generate a corresponding respective grouped error data bit GED[1] . . . GED[8]. The grouped error data GED[1 . . . 8] is the data that is temporarily stored in the intermediate caches prior to merging into the final tag images.

The value of the grouped error data controls whether or not the counter 42, 52, CNTR[1] . . . CNTR[8] corresponding to the group should be updated (i.e., incremented or decremented to "count" a failure).

The following examples, which assume a "0" designates a fail, a "1" designates a pass, a "0" designates inclusion of the corresponding IO bit in the group, and a "1" designates exclusion of the corresponding IO bit from the group, illustrate operation of the grouping configuration function 200:

To test one IO bit per counter, the group bitmasks GroupMask[1] . . . GroupMask[8] (shown below as GM[1] . . . GM[8]) may be set up as follows:

GroupMask[1]=01111111
GroupMask[2]=10111111
GroupMask[3]=11011111
GroupMask[4]=11101111
GroupMask[5]=11110111
GroupMask[6]=11111011
GroupMask[7]=11111101
GroupMask[8]=11111110

Suppose the error data IO=11011111 (i.e., fail on IO[3], all others passing). Then, IO[1 . . . 8] OR GM[1]=11111111; AND of all bits=1; CNTR[1] hold IO[1 . . . 8] OR GM[2]=11111111; AND of all bits=1; CNTR[2] hold IO[1 . . . 8] OR GM[3]=11011111; AND of all bits=0; CNTR[3] decrement IO[1 . . . 8] OR GM[4]=11111111; AND of all bits=1; CNTR[4] hold IO[1 . . . 8] OR GM[5]=11111111; AND of all bits=1; CNTR[5] hold IO[1 . . . 8] OR GM[6]=11111111; AND of all bits=1; CNTR[6] hold IO[1 . . . 8] OR GM[7]=11111111; AND of all bits=1; CNTR[7] hold IO[1 . . . 8] OR GM[8]=11111111; AND of all bits=1; CNTR[8] hold and GED[1 . . . 8]=11011111.

Suppose the error data IO=10000001 (pass on IO[1] and IO[8], all others failing). Then, IO[1 . . . 8] OR GM[1]=11111111; AND of all bits=1; CNTR[1] hold IO[1 . . . 8] OR GM[2]=10111111; AND of all bits=0; CNTR[2] decrement IO[1 . . . 8] OR GM[3]=11011111; AND of all bits=0; CNTR[3] decrement IO[1 . . . 8] OR GM[4]=11101111; AND of all bits=0; CNTR[4] decrement IO[1 . . . 8] OR GM[5]=11110111; AND of all bits=0; CNTR[5] decrement IO[1 . . . 8] OR GM[6]=11111011; AND of all bits=0; CNTR[6] decrement
IO[1 . . . 8] OR GM[7]=11111101; AND of all bits=0; CNTR[7] decrement
IO[1 . . . 8] OR GM[8]=11111111; AND of all bits=1; CNTR[8] hold and GED[1 . . . 8]=10000001.

To test two IO bits per counter, the group bitmasks Group-Mask[1] . . . GroupMask[8] (shown below as GM[1] . . . GM[8]) may be set up as follows:
GroupMask[1]=00111111
GroupMask[2]=11001111
GroupMask[3]=11110011
GroupMask[4]=11111100
GroupMask[5]=11111111
GroupMask[6]=11111111
GroupMask[7]=11111111
GroupMask[8]=11111111

Suppose the error data IO=00100000 (i.e., fail on IO[3], all others passing). Then,
IO[1 . . . 8] OR GM[1]=11111111; AND of all bits=1; CNTR[1] hold
IO[1 . . . 8] OR GM[2]=11011111; AND of all bits=0; CNTR[2] decrement
IO[1 . . . 8] OR GM[3]=11111111; AND of all bits=1; CNTR[3] hold
IO[1 . . . 8] OR GM[4]=11111111; AND of all bits=1; CNTR[4] hold
IO[1 . . . 8] OR GM[5]=11111111; AND of all bits=1; CNTR[5] hold
IO[1 . . . 8] OR GM[6]=11111111; AND of all bits=1; CNTR[6] hold
IO[1 . . . 8] OR GM[7]=11111111; AND of all bits=1; CNTR[7] hold
IO[1 . . . 8] OR GM[8]=11111111; AND of all bits=1; CNTR[8] hold and GED[1 . . . 8]=10111111.

Suppose the error data IO=10000001 (pass on IO[1] and IO[8], all others failing). Then,
IO[1 . . . 8] OR GM[1]=10111111; AND of all bits=0; CNTR[1] decrement
IO[1 . . . 8] OR GM[2]=11001111; AND of all bits=0; CNTR[2] decrement
IO[1 . . . 8] OR GM[3]=11010011; AND of all bits=0; CNTR[3] decrement
IO[1 . . . 8] OR GM[4]=11111101; AND of all bits=0; CNTR[4] decrement
IO[1 . . . 8] OR GM[5]=11111111; AND of all bits=1; CNTR[5] hold
IO[1 . . . 8] OR GM[6]=11111111; AND of all bits=1; CNTR[6] hold
IO[1 . . . 8] OR GM[7]=11111111; AND of all bits=1; CNTR[7] hold
IO[1 . . . 8] OR GM[8]=11111111; AND of all bits=1; CNTR[8] hold and GED[1 . . . 8]=00001111.

To test four IO bits per counter, the group bitmasks GroupMask[1] . . . GroupMask[8] (shown below as GM[1] . . . GM[8]) may be set up as follows:
GroupMask[1]=00001111
GroupMask[2]=11110000
GroupMask[3]=11111111
GroupMask[4]=11111111
GroupMask[5]=11111111
GroupMask[6]=11111111
GroupMask[7]=11111111
GroupMask[8]=11111111

Suppose the error data IO=00100000 (i.e., fail on IO[3], all others passing). Then,
IO[1 . . . 8] OR GM[1]=11011111; AND of all bits=0; CNTR[1] decrement
IO[1 . . . 8] OR GM[2]=11111111; AND of all bits=1; CNTR[2] hold
IO[1 . . . 8] OR GM[3]=11111111; AND of all bits=1; CNTR[3] hold
IO[1 . . . 8] OR GM[4]=11111111; AND of all bits=1; CNTR[4] hold
IO[1 . . . 8] OR GM[5]=11111111; AND of all bits=1; CNTR[5] hold
IO[1 . . . 8] OR GM[6]=11111111; AND of all bits=1; CNTR[6] hold
IO[1 . . . 8] OR GM[7]=11111111; AND of all bits=1; CNTR[7] hold
IO[1 . . . 8] OR GM[8]=11111111; AND of all bits=1; CNTR[8] hold and GED[1 . . . 8]=01111111.

Suppose the error data IO=10000001 (pass on IO[1] and IO[8], all others failing). Then,
IO[1 . . . 8] OR GM[1]=10001111; AND of all bits=0; CNTR[1] decrement
IO[1 . . . 8] OR GM[2]=11110001; AND of all bits=0; CNTR[2] decrement
IO[1 . . . 8] OR GM[3]=11111111; AND of all bits=1; CNTR[3] hold
IO[1 . . . 8] OR GM[4]=11111111; AND of all bits=1; CNTR[4] hold
IO[1 . . . 8] OR GM[5]=11111111; AND of all bits=1; CNTR[5] hold
IO[1 . . . 8] OR GM[6]=11111111; AND of all bits=1; CNTR[6] hold
IO[1 . . . 8] OR GM[7]=11111111; AND of all bits=1; CNTR[7] hold
IO[1 . . . 8] OR GM[8]=11111111; AND of all bits=1; CNTR[8] hold and GED[1 . . . 8]=00001111.

It is to be understood that the implementation of the grouping configuration function 200 and accompanying examples are presented herein by way of example only and not limitation. Those skilled in the art will understand that the logic function may be implemented in many equivalent ways, and the convention used to designate "pass" and "fail" of the IO bits and to designate "inclusion" and "exclusion" of an IO bit in a particular group may be alternately implemented. In addition, any combination of the IO bits may be grouped, and IO bits may belong to more than one group.

As noted previously, the effect of the grouping configuration function 40 is to group pins together that should be counted together as a single failure. If grouping is implemented, it is the grouped error data GED[1 . . . Z] that is temporarily stored and operated on during the merge step into the final tag images.

It is to be noted that in addition to the ability to extract sparse failure information from an error data image, the method of FIG. 3 may be performed on any segment or sub-segment of the memory device. This is advantageous because it allows testing of only a portion of the memory device if desired.

Additionally, in testers that have native word widths greater than the word width of the memory under test, multiple memories under test may be tested simultaneously. For example, suppose that a memory tester has a native word width of thirty-two bits, while the memory DUT has a word with of eight bits (IO[1 . . . 8]). It may be desirable then to test four of these eight-bit memory DUTs at a time by partitioning the native word width of the tester into four eight-bit segments, one for each of four DUTs. In this case, error image could be scanned four times, each time using a different set of group masks, resulting in a unique row and column tag image for each DUT. Alternatively, the finalTag image could provide enough width to support 4 DUTs, in which case a single scan through the error image would yield row and tag images for all 4 DUTs simultaneously.

Figure 21:
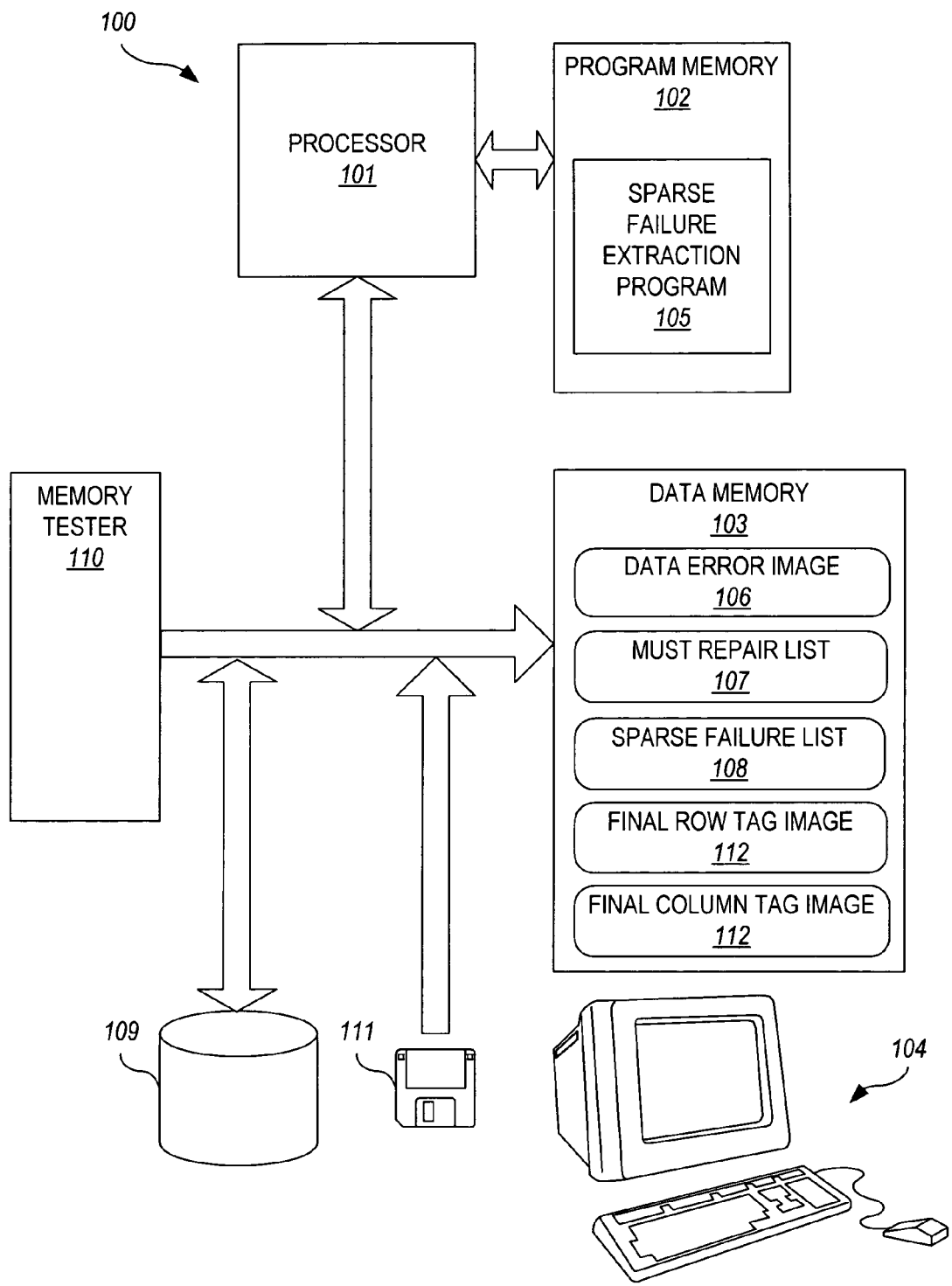
FIG. 21 is a block diagram illustrating a computer system for extracting failure information from an error data image of a memory device.

FIG. 21 is a computer system 100 that performs sparse failure information extraction from an error data image of a memory device under test. The computer system 100 includes a processor 101, program memory 102, data memory 103, and input/output means 104 (for example, including a keyboard, a mouse, a display monitor, external memory readers, etc.) in accordance with well-known computer systems. A program 105 comprising program instructions executable by the processor 101 that implements sparse failure information extraction (for example, according to the method of FIG. 3) may be stored in the program memory 102 or read from a computer readable storage medium (such as an external disk 109, or floppy disk 111) accessible by the computer system 100. The computer system 100 reads a data error image 106 that may be generated by a memory tester 110. The data error image 106 may be stored in a computer readable storage medium (such as an external disk 109, or floppy disk 111) accessible by the computer system 100, which may be subsequently read by the computer system 100 and stored in data memory 103. The processor 101 may execute the program instructions of the program 105 that may generate a must repair list 107, a sparse failure list 108, and final row and column tag images 112, 113.

While illustrative embodiments have been presented in which the plurality of dimensions include a row dimension and a column dimension, the plurality of dimensions may additionally or alternatively include any of a depth dimension, one or more diagonal dimensions, and/or one or more other memory cell grouping patterns with corresponding address components that access memory cell groups along the associated dimensions.

The embodiments described and illustrated herein may be implemented in software, firmware or hardware, or any suitable combination thereof. The method and apparatus of the invention may be implemented by a computer or microprocessor process in which instructions are executed, the instructions being stored for execution on a computer-readable medium and being executed by any suitable instruction processor. Alternative embodiments are contemplated, however, and are within the spirit and scope of the invention.

What is claimed is:

1. A method for extracting repair information from an error data image of a memory device, the error data image comprising corresponding error data for each of a plurality of memory cells organized into a plurality of memory cell groups along a plurality of dimensions of the memory device, each memory cell group addressable by one of a plurality of address components corresponding to one of the plurality of dimensions, the error data image comprising a plurality of bits each bit corresponding to a different one of the memory cells in the memory device and having a value indicating whether or not the corresponding memory cell is defective, the method comprising:

scanning the error data image for failures in a first set of memory cell groups organized along a first dimension between a selected set of addresses, keeping track of respective numbers of failures seen in each of the respective memory cell groups in the first set, and keeping track of and designating as a must-repair memory cell group any memory cell group whose respective number of failures equals or exceeds a first maximum failure threshold; and scanning the error data image for failures in a second set of memory cell groups organized along a second dimension between the selected set of addresses, keeping track of respective numbers of failures seen in each of the respective memory cell groups in the second set, and keeping track of and designating as a must-repair memory cell group any memory cell group whose respective number of failures equals or exceeds a second maximum failure threshold; and generating one or both of a first tag image associated with memory cell groups of the first set and a second tag image associated with memory cell groups of the second set, the first tag image indicating memory cells of the first set containing failures and the second tag image indicating memory cell groups of the second set containing failures, wherein at least one of the first tag image and the second tag image exclude indication of failures in designated must-repair memory cell groups of the corresponding set.

2. The method of claim 1, further comprising:
maintaining a list of memory addresses of designated must-repair memory cell groups.

3. The method of claim 1, further comprising:
maintaining a list of memory addresses containing sparse failures.

4. A method for extracting repair information from an error data image of a memory device, the error data image comprising corresponding error data for each of a plurality of memory cells organized into a plurality of memory cell groups along a plurality of dimensions of the memory device, each memory cell group addressable by one of a plurality of address components corresponding to one of the plurality of dimensions, the error data image comprising a plurality of bits each bit corresponding to a different one of the memory cells in the memory device and having a value indicating whether or not the corresponding memory cell is defective, the method comprising:

scanning the error data image for failures in a first set of memory cell groups organized along a first dimension between a selected set of addresses, keeping track of respective numbers of failures per simultaneously addressable IO bit in each of the respective memory cell groups in the first set, and keeping track of and designating as a must-repair memory cell group any memory cell group whose respective number of failures equals or exceeds a first maximum failure threshold;

scanning the error data image for failures in a second set of memory cell groups organized along a second dimension between the selected set of addresses, keeping track of respective numbers of failures per simultaneously addressable IO bit in each of the respective memory cell groups in the second set, and keeping track of and designating as a must-repair memory cell group any memory cell group whose respective number of failures equals or exceeds a second maximum failure threshold; and generating one or both of a first tag image associated with memory cell groups of the first set and a second tag image associated with memory cell groups of the second set, the first tag image indicating memory cells of the first set containing failures per simultaneously addressable IO bit and the second tag image indicating memory cell groups of the second set containing failures per simultaneously addressable IO bit, wherein at least one of the first tag image and the second tag image exclude indication of failures in designated must-repair memory cell groups of the corresponding set.

5. The method of claim 4, further comprising:
maintaining a list of memory addresses of designated must-repair memory cell groups.

6. The method of claim 4, further comprising:
maintaining a list of memory addresses containing sparse failures.

7. A method for extracting repair information from an error data image of a memory device, the error data image comprising corresponding error data for each of a plurality of memory cells organized into a plurality of memory cell groups along a plurality of dimensions of the memory device, each memory cell group addressable by one of a plurality of address components corresponding to one of the plurality of dimensions, the error data image comprising a plurality of bits each bit corresponding to a different one of the memory cells in the memory device and having a value indicating whether or not the corresponding memory cell is defective, the method comprising:
scanning the error data image for failures in a first set of memory cell groups organized along a first dimension between a selected set of addresses, grouping simultaneously addressable IO bits of the respective memory cell groups in the first set into a plurality of first IO bit groups, keeping track of respective numbers of failures per first IO bit group in each of the respective memory cell groups in the first set, and keeping track of and designating as a must-repair memory cell group any memory cell group whose respective number of failures equals or exceeds a first maximum failure threshold; and
scanning the error data image for failures in a second set of memory cell groups organized along a second dimension between the selected set of addresses, grouping simultaneously addressable IO bits of the respective memory cell groups in the second set into a plurality of second IO bit groups, keeping track of respective numbers of failures per second IO bit group in each of the respective memory cell groups in the second set, and keeping track of and designating as a must-repair memory cell group any memory cell group whose respective number of failures equals or exceeds a second maximum failure threshold; and
generating one or both of a first tag image associated with memory cell groups of the first set and a second tag image associated with memory cell groups of the second set, the first tag image indicating memory cells of the first set containing failures and the second tag image indicating memory cell groups of the second set containing failures, wherein at least one of the first tag image and the second tag image exclude indication of failures in designated must-repair memory cell groups of the corresponding set.

8. The method of claim 7, further comprising:
maintaining a list of memory addresses of designated must-repair memory cell groups.

9. The method of claim 7, further comprising:
maintaining a list of memory addresses containing sparse failures.

10. A computer readable storage medium tangibly embodying program instructions implementing a method for extracting repair information from an error data image of a memory device, the error data image comprising corresponding error data for each of a plurality of memory cells organized into a plurality of memory cell groups along a plurality of dimensions of the memory device, each memory cell group addressable by one of a plurality of address components corresponding to one of the plurality of dimensions, the error data image comprising a plurality of bits each bit corresponding to a different one of the memory cells in the memory device and having a value indicating whether or not the corresponding memory cell is defective, the method comprising:
scanning the error data image for failures in a first set of memory cell groups organized along a first dimension between a selected set of addresses, keeping track of respective numbers of failures seen in each of the respective memory cell groups in the first set, and keeping track of and designating as a must-repair memory cell group any memory cell group whose respective number of failures equals or exceeds a first maximum failure threshold; and
scanning the error data image for failures in a second set of memory cell groups organized along a second dimension between the selected set of addresses, keeping track of respective numbers of failures seen in each of the respective memory cell groups in the second set, and keeping track of and designating as a must-repair memory cell group any memory cell group whose respective number of failures equals or exceeds a second maximum failure threshold; and
generating one or both of a first tag image associated with memory cell groups of the first set and a second tag image associated with memory cell groups of the second set, the first tag image indicating memory cells of the first set containing failures and the second tag image indicating memory cell groups of the second set containing failures, wherein at least one of the first tag image and the second tag image exclude indication of failures in designated must-repair memory cell groups of the corresponding set.

11. The computer readable storage medium of claim 10, wherein:
the step of keeping track of respective numbers of failures seen in each of the respective memory cell groups in the first set comprises keeping track of respective numbers of failures per simultaneously addressable IO bit in each of the respective memory cell groups in the first set; and
the step of keeping track of respective numbers of failures seen in each of the respective memory cell groups in the second set comprises keeping track of respective numbers of failures per simultaneously addressable IO bit in each of the respective memory cell groups in the second set.

12. The computer readable storage medium of claim 10, wherein:
the step of keeping track of respective numbers of failures seen in each of the respective memory cell groups in the first set comprises grouping simultaneously addressable IO bits of the respective memory cell groups in the first set into a plurality of first IO bit groups, and keeping track of respective numbers of failures per first IO bit group in each of the respective memory cell groups in the first set; and
the step of keeping track of respective numbers of failures seen in each of the respective memory cell groups in the second set comprises grouping simultaneously addressable IO bits of the respective memory cell groups in the second set into a plurality of first IO bit groups, and keeping track of respective numbers of failures per first IO bit group in each of the respective memory cell groups in the second set.

13. The computer readable storage medium of claim 10, the method further comprising:
maintaining a list of memory addresses of designated must-repair memory cell groups.

14. The computer readable storage medium of claim 10, the method further comprising:

maintaining a list of memory addresses containing sparse failures.

15. A system for extracting repair information from an error data image of a memory device, the error data image comprising corresponding error data for each of a plurality of memory cells organized into a plurality of memory cell groups along a plurality of dimensions of the memory device, each memory cell group addressable by one of a plurality of address components corresponding to one of the plurality of dimensions, the error data image comprising a plurality of bits each bit corresponding to a different one of the memory cells in the memory device and having a value indicating whether or not the corresponding memory cell is defective, the system comprising:

a processor which scans the error data image for failures in a first set of memory cell groups organized along a first dimension between a selected set of addresses, keeping track of respective numbers of failures seen in each of the respective memory cell groups in the first set, and keeping track of and designating as a must-repair memory cell group any memory cell group whose respective number of failures equals or exceeds a first maximum failure threshold; and which scans scanning the error data image for failures in a second set of memory cell groups organized along a second dimension between the selected set of addresses, keeping track of respective numbers of failures seen in each of the respective memory cell groups in the second set, and keeping track of and designating as a must-repair memory cell group any memory cell group whose respective number of failures equals or exceeds a second maximum failure threshold; and which generates one or both of a first tag image associated with memory cell groups of the first set and a second tag image associated with memory cell groups of the second set, the first tag image indicating memory cells of the first set containing failures and the second tag image indicating memory cell groups of the second set containing failures, wherein at least one of the first tag image and the second tag image exclude indication of failures in designated must-repair memory cell groups of the corresponding set.

16. The system of claim 15, further comprising:

a memory tester which generates the error data image.

* * * * *